United States Patent
Saito et al.

(10) Patent No.: US 6,509,277 B1
(45) Date of Patent: Jan. 21, 2003

(54) METHOD OF MANUFACTURING SEMICONDUCTOR INTEGRATED CIRCUIT DEVICE HAVING INSULATRO FILM FORMED FROM LIQUID CONTAINING POLYMER OF SILICON, OXYGEN, AND HYDROGEN

(75) Inventors: Masayoshi Saito, Hachiouji (JP); Katsuhiko Hotta, Hachiouji (JP); Masayoshi Hirasawa, Ome (JP); Masayuki Kojima, Kokubunji (JP); Hiroyuki Uchiyama, Tachikawa (JP); Hiroyuki Maruyama, Ome (JP); Takuya Fukuda, Kodaira (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 11 days.

(21) Appl. No.: 09/664,381

(22) Filed: Sep. 18, 2000

Related U.S. Application Data

(62) Division of application No. 09/536,751, filed on Mar. 28, 2000.

(30) Foreign Application Priority Data

Mar. 31, 1999 (JP) .............................................. 11-093871

(51) Int. Cl.[7] ...................... H01L 21/302; H01L 21/461
(52) U.S. Cl. ........................ 438/723; 438/240; 438/253; 438/396
(58) Field of Search ................................ 438/723, 724, 438/240, 253–255, 396, 398; 257/632, 634, 635, 642, 644, 650, 750, 758

(56) References Cited

U.S. PATENT DOCUMENTS

| | | | | |
|---|---|---|---|---|
| 6,087,724 A | * | 7/2000 | Shields et al. | 257/734 |
| 6,114,186 A | * | 9/2000 | Jeng et al. | 438/623 |
| 6,187,624 B1 | * | 2/2001 | Huang | 438/253 |
| 6,225,240 B1 | * | 5/2001 | You et al. | 427/240 |
| 6,232,237 B1 | * | 5/2001 | Tamaoka et al. | 134/1.2 |
| 6,277,733 B1 | * | 8/2001 | Smith | 438/636 |
| 6,278,174 B1 | * | 8/2001 | Havemann et al. | 257/524 |
| 6,331,480 B1 | * | 12/2001 | Tsai et al. | 438/624 |

FOREIGN PATENT DOCUMENTS

| | | |
|---|---|---|
| JP | 878528 | 3/1996 |
| JP | 8125021 | 5/1996 |
| JP | 9252098 | 9/1997 |
| JP | 9283515 | 10/1997 |
| JP | 9330982 | 12/1997 |
| JP | 10107026 | 4/1998 |

* cited by examiner

Primary Examiner—Richard Booth
Assistant Examiner—Jennifer M. Kennedy
(74) Attorney, Agent, or Firm—Antonelli, Terry, Stout & Kraus, LLP

(57) ABSTRACT

An SOG film 16 obtained by heat-treating a polysilazan type SOG film at high temperature of about 800° C. is used as a planarized insulating film to be formed on the gate electrode 9 of a MISFET (Qs, Qn, Qp). A polysilazan SOG film 57 not subjected to such a heat treatment is used as interlayer insulating film arranged among upper wiring layers (54, 55, 56, 62, 63).

26 Claims, 37 Drawing Sheets ratio of etching rates when forming a contact hole in SiO₂ films formed by various techniques heat treatment temperature dependency of etching rate ($O_2$-containg atmosphere)

relationship between contact angle and diameter of water drop and wavelength when HSQ-SOG film surface is irradiated with UV rays relationship between contact angle and diameter of water drop (c.a., 0.05code color, dropped by means of a fountain pen filler) and duration or irradiation when HSQ-SOG film surface is irradiated with UV rays

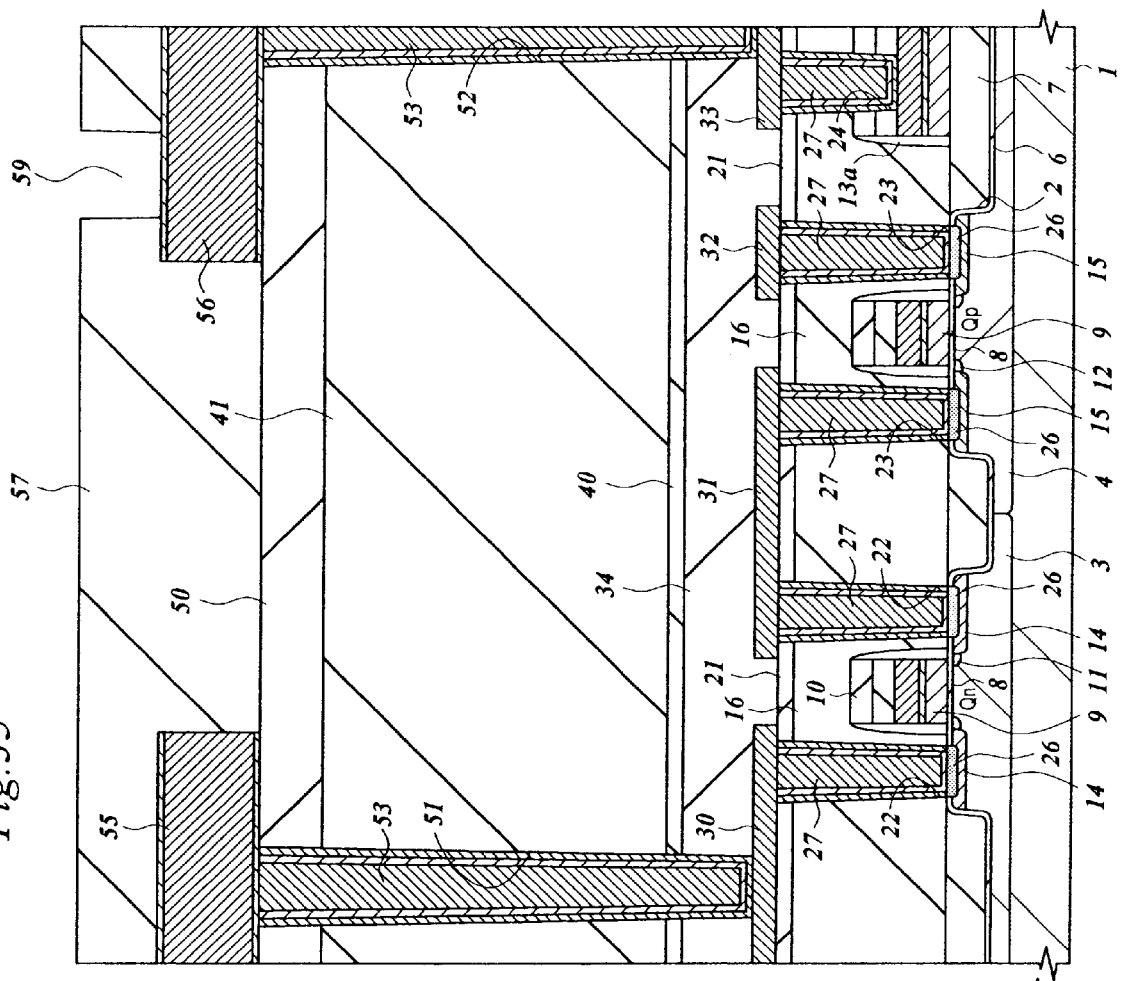
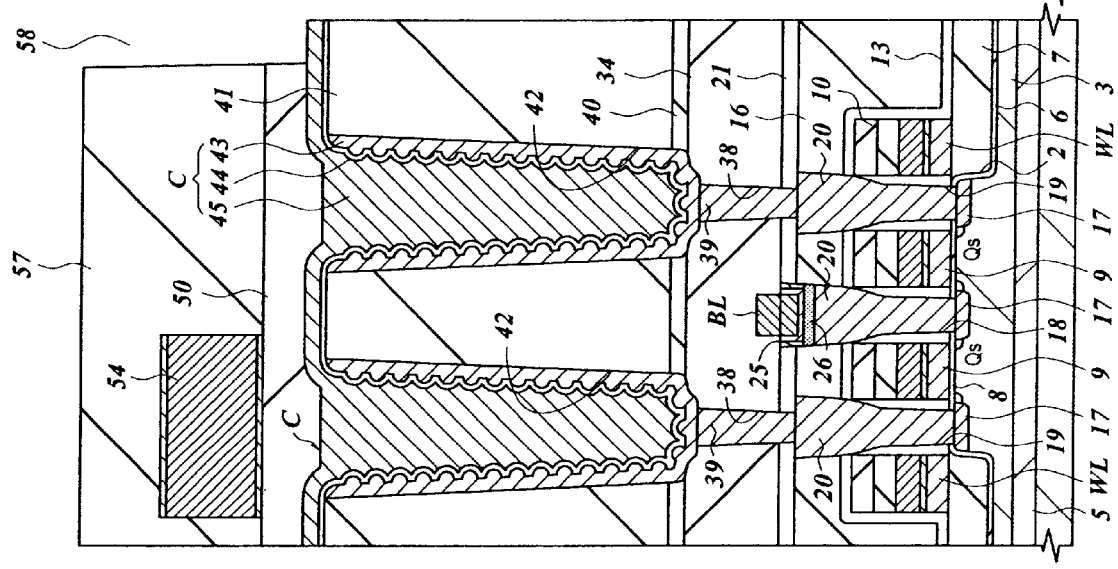
Fig.35

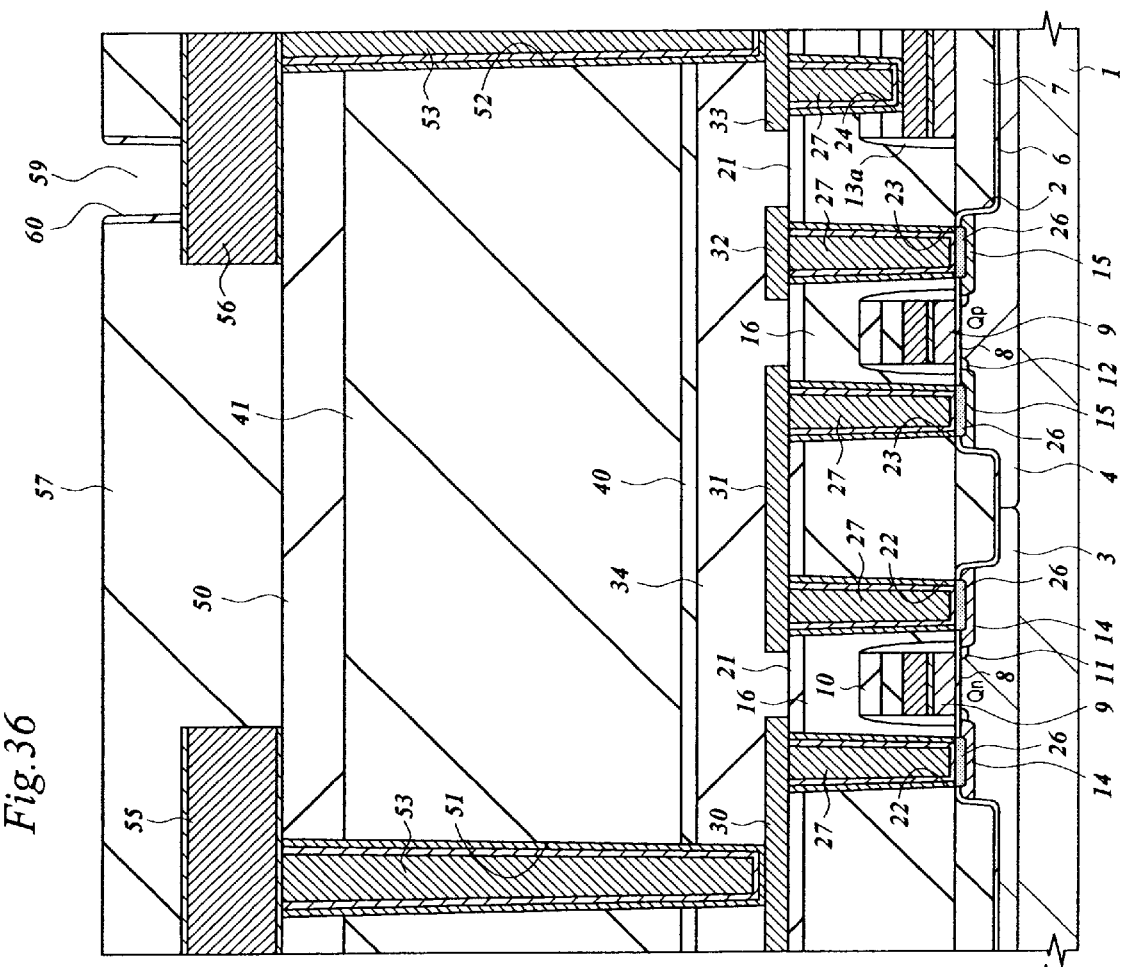
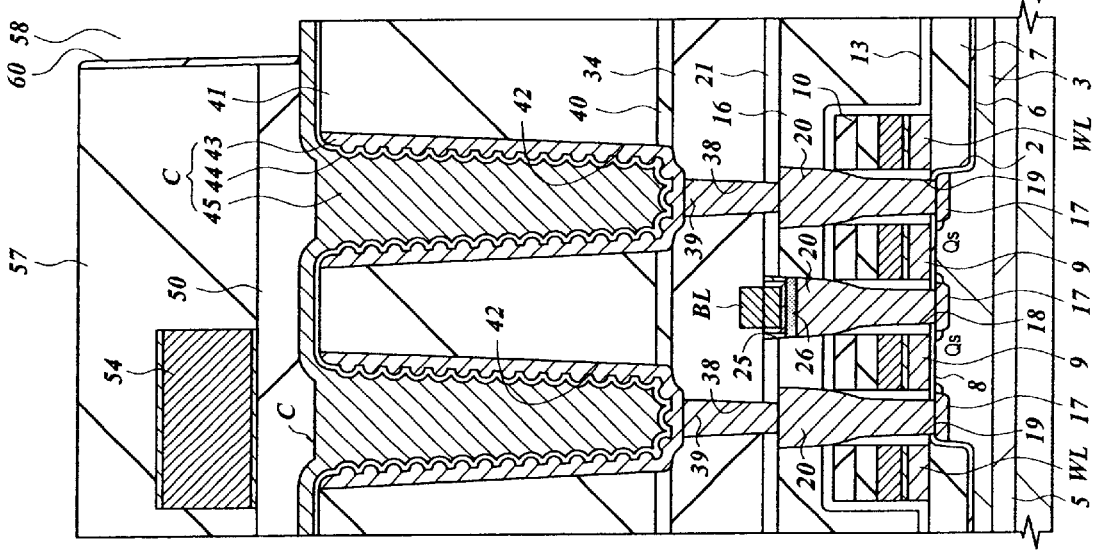
Fig.36

METHOD OF MANUFACTURING SEMICONDUCTOR INTEGRATED CIRCUIT DEVICE HAVING INSULATRO FILM FORMED FROM LIQUID CONTAINING POLYMER OF SILICON, OXYGEN, AND HYDROGEN

This application is a Divisional application of Ser. No. 09/536,751, filed Mar. 28, 2000.

TECHNICAL FIELD OF THE INVENTION

This invention relates to a semiconductor integrated circuit device and also to a method of manufacturing thereof. More particularly, the present invention relates to an insulating film structure for forming a MISFET (Metal Insulator Semiconductor Field Effect Transistor) having micro-dimensions and also to a technique that can effectively be used for a process of forming such a structure.

BACKGROUND OF THE INVENTION

Conventionally, the process of planarizing an insulating film formed on the gate electrode of a MISFET is carried out by means of a method of reflowing the deposited BPSG (Baron-doped Phospho Silicate Glass) film on the gate electrode at high temperature between about 85 and 90° C. However, in the current trend of down-sizing MISFETs to micro-dimensions, while the space between the gate electrodes of two adjacently located devices becoming small, it is highly difficult to use a BPSG film as insulating film to be planarized on the gate electrode.

A so-called self align contact technique (see, inter alia, Japanese Patent Application Laid-Open No. 9-252098) is typically used for the process of connecting wires to the source/drain of a MISFET having micro-dimensions by way of a contact hole. It is a technique of forming a silicon nitride film on the upper and lateral surfaces of the gate electrode in order to produce a contact hole by utilizing the difference between the rate of etching the silicon nitride film and that of etching the insulating film that is typically made of silicon oxide and deposited on the silicon nitride film so that no margin has to be taken into consideration for the alignment of the contact hole and the gate electrode.

However, when a silicon nitride film is formed on the upper and lateral surfaces of the gate electrode of a very fine MISFET, the space between the gate electrodes of two adjacently located devices can become extremely small. Then, voids can appear in the BPSG film buried in the space. Additionally, in the case of a device to be manufactured on a design rule adapted to dimensions of 0.25 μm or less, the performance of the manufactured MISFET can become degraded when a BPSG film that requires a heat treatment involving temperature above 800° C. is applied thereto after forming the MISFET.

A Spin On Glass (SOG) film that can be obtained by applying a chemical solution of a silicon compound dissolved in an organic solvent and baking it at temperature between about 400 and 450° C. to gasify and dispel the solvent is expected to be used as a planarized insulating film to be formed on the gate electrode of a MIS device with dimensions of 0.25 μm or less requiring low process temperature because it shows an excellent gap filling effect for the space between the gate electrodes of two adjacently located devices and not costly.

Additionally, an SOG film formed by using hydrosilsesquioxan as raw material shows a low dielectric constant if compared with a silicon oxide film formed by means of CVD and hence is expected to provide an effect of reducing the wiring delay when used as interlayer insulating layer of a multilayer metal wiring system.

On the other hand, SOG film has drawbacks including (I) that it can give rise to corrosion to metal wires because it is less resistant to moisture than a CVD-silicon oxide film and (ii) that it is soft and hence can hardly withstand chemical mechanical polishing (CMP) so that, when planarizing a global region including densely wired area and scarcely wired areas, the CMP process has to be conducted after depositing a silicon oxide film on the SOG film. A variety of techniques have been proposed to bypass the drawbacks.

For instance, Japanese Patent Application Laid-Open No. 3-330982 discloses a technique of reducing the hygroscopicity of SOG film by baking the SOG film at temperature between 400 and 750° C., subjecting it, if necessary, to an oxygen plasma processing operation (or an argon injecting operation), forming thereon an anti-moisture film (e.g., CVD-oxide film) and then thermally treating it at temperature between 550 and 750° C.

Japanese Patent Application Laid-Open No. 8-78528 discloses a technique of preventing the aluminum (Al) wires of a device from being corroded by the gas (containing moisture) produced by the SOG film as a result of degasification by forming a through hole through the insulating film (CVD-oxide film/SOG film/CVD-oxide film) on the aluminum wire, discharging the gas by thermally treating the device at temperature between 300 and 350° C. and subsequently forming a side wall spacer of silicon oxide film along the lateral wall of the through hole.

Japanese Patent Application Laid-Open No. 9-283515 describes a technique of suppressing micro-projections that can appear on the surface of a ceramic-like silicon oxide film when an SOG film is heat-treated in an inert gas atmosphere, the technique comprising steps of spin-coating a solution of hydrosilsesquioxan (HSQ) onto a substrate, conducting a first heat treatment process at temperature lower than 400° C. to turn it into a pre-ceramic film and subsequently conducting a second heat treatment process at temperature lower than 400° C. in an oxidizing gas atmosphere (oxygen+ nitrogen) to produce a ceramic-like silicon oxide film.

Japanese Patent Application Laid-Open No. 8-125021 describes a technique of perfectly hardening an SOG film comprising steps of quasi-hardening the SOG film in a preliminary heat treatment process conducted at temperature between 70 and 220° C., modifying a surface layer of the SOG film by treating it with ozone/ultraviolet rays and subsequently heat-treating it in a process conducted in an oxygen or nitrogen atmosphere and including a pre-heat-treatment at 400 to 500° C. and a post-heat-treatment at 700 to 1,000° C.

Finally, Japanese Patent Application Laid-Open No. 10-107026 describes a technique of improving the ant-crack performance of an SOG film made of hydrosilsesquioxan (HSQ) and raising the density thereof by curing it with electron beams at temperature between room temperature and 500° C.

SUMMARY OF THE INVENTION

The inventors of the present invention have looked into the feasibility of using polysilazan type SOG film and hydrosilsesquioxan type SOG film for the planarized insulating film to be formed on the gate electrode of a MISFET.

Polysilazan is characterized by having a molecular structure where nitrogen (N) atoms and hydrogen (H) atoms are bonded to each silicon (Si) atom. For forming SOG film, using polysilazan as raw material, firstly a chemical solution prepared by dissolving polysilazan into a solvent is applied onto a substrate by spin coating and then the applied solution is baked to gasify and dispel the solvent. Subsequently, the SOG film is subjected to a steam-oxidation process at high temperature to make the hydrogen atoms bonded to the silicon atoms and the NH-radicals react with each other in a manner as expressed by chemical formula (1) for each molecule. Then, the produced hydrogen gas and ammonium gas are made to leave the film to produce a dense and highly moisture-resistant SOG film having Si—O—Si bonds.

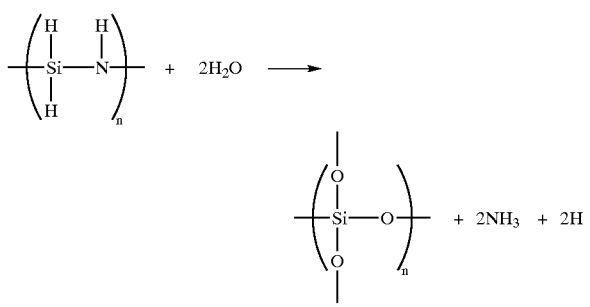

However, the inventors of the present invention have found that the obtained SOG film contains a trace of residual nitrogen originating from polysilazan. Therefore, when an SOG film is formed on the gate electrode with a silicon nitride film interposed therebetween, it is no longer possible to secure a satisfactory level of etch selectivity necessary for forming a contact hole by utilizing the difference between the rate of etching the silicon nitride film and that of etching the SOG film particularly if the contact hole is required to have a small diameter.

On the other hand, hydrosilsesquioxan has a molecular structure where oxygen (O) atoms and hydrogen (H) atoms are bonded to each silicon (Si) atom and hence does not contain any nitrogen in the molecule. For forming SOG film, using hydrosilsesquioxan as raw material, a chemical solution prepared by dissolving hydrosilsesquioxan into a solvent is applied onto a substrate by spin coating and then the applied solution is heat-treated to gasify and dispel the solvent. As a result, a chemical reaction as expressed by formula (2) below takes place to oxidize the Si—H bonds by 20 to 30% and produce an SOG film having Si—OH bonds.

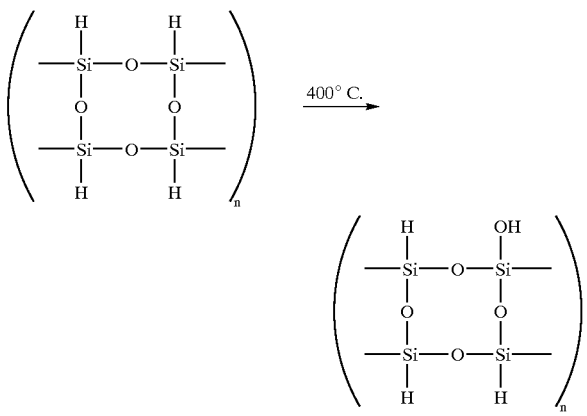

However, since the hydrosilsesquioxan type SOG film has Si—H bonds in each molecule, it gives rise to a problem of producing discharging gas on hydrogen if a heat treatment is conducted at far higher temperature than 400° C. in the process after forming the film.

For example, hydrogen gas and other gases are produced during the process of forming a through hole through the prepared hydrosilsesquioxan type SOG film and burying a conductor layer in the through hole if the temperature of forming the conductor layer exceeds 400° C. Then, the operation of burying the conductor layer proceeds insufficiently to consequently raise the resistance of layer. Additionally, since the etching condition can become modified by the generated hydrogen gas, it is highly difficult to produce a through showing a high aspect ratio.

In view of the above identified circumstances, it is therefore an object of the present invention to provide a technique of forming an insulating film that can encourage the efforts for down-sizing MISFETs.

Other objects and novel features of the present invention will become apparent in the following description of the invention made by referring to the accompanying drawings that illustrate preferred embodiments of the invention.

Firstly, the present invention will be summarily described.

(1) A semiconductor integrated circuit device comprising: a semiconductor substrate having a principal surface; a MISFET formed on said principal surface of said semiconductor substrate; a first wiring layer formed on said MISFET with a first insulating film interposed therebetween; and a second wiring layer formed on said first wiring layer with a second insulating film interposed therebetween;

each of said first insulating film and said second insulating film including an insulating film formed by applying a liquid substance containing a polymer of silicon, oxygen and hydrogen as principal ingredient, the relative dielectric constant of said second insulating film being lower than that of said first insulating film.

(2) A semiconductor integrated circuit device as set forth in (1) above, wherein said polymer is hydrosilsesquioxan.

(3) A semiconductor integrated circuit device as set forth in (1) above, wherein the hydrogen content of said second insulating film is higher than that of said first insulating film.

(4) A semiconductor integrated circuit device as set forth in (1) above, wherein the surface of said first insulating film is planarized by polishing.

(5) A semiconductor integrated circuit device comprising: a semiconductor substrate having a principal surface, a MISFET formed on said principal surface of said semiconductor substrate; a first insulating film formed on said MISFET; a capacitive element formed on said first insulating film with a first electrode, a second electrode and a dielectric film interposed between said first and second electrodes; and a second insulating film formed on said capacitive element;

each of said first insulating film and said second insulating film including an insulating film formed by applying a liquid substance containing a polymer of silicon, oxygen and hydrogen as principal ingredient; and hydrogen content of said second insulating film being lower than that of said first insulating film.

(6) A semiconductor integrated circuit device as set forth in (5) above, wherein the relative dielectric constant of said second insulating film is higher than that of said first insulating film.

(7) A semiconductor integrated circuit device as set forth in (5) above, further comprising a first metal wire and a second metal wire formed on said capacitive element, said second insulating film being interposed between said first metal wire and said second metal wire.

(8) A semiconductor integrated circuit device comprising: a semiconductor substrate having a principal surface; a semiconductor region formed on said principal surface of said semiconductor substrate; a silicon nitride film formed on said semiconductor region; a first insulating film formed on said silicon nitride film and showing an etching rate different from said silicon nitride film; a first contact hole formed through said first insulating film and said silicon nitride film; a first conductor film formed in said first contact hole and electrically connected to said semiconductor region; and a second conductor film formed on said first insulating film with a second insulating film interposed therebetween;

said first insulating film including an insulating film formed by applying a liquid substance containing a polymer of silicon, oxygen and hydrogen as principal ingredient; and said second insulating film including an insulating film formed by applying a liquid substance containing a polymer of silicon, nitrogen and hydrogen as principal ingredient.

(9) A semiconductor integrated circuit device as set forth in (8) above, wherein said polymer of silicon, oxygen and hydrogen is hydrosilsesquioxan and said polymer of silicon, nitrogen and hydrogen is silazan.

(10) A semiconductor integrated circuit device comprising: a semiconductor substrate having a principal surface; a semiconductor region formed on said principal surface of said semiconductor substrate; a silicon nitride film formed on said semiconductor region; a first insulating film formed on said silicon nitride film and showing an etching rate different from said silicon nitride film; a first contact hole formed through said first insulating film and said silicon nitride film; and a first conductor film formed in said first contact hole and electrically connected to said semiconductor region;

said first insulating film being formed by applying a liquid substance containing a polymer of silicon, oxygen and hydrogen as principal ingredient.

(11) A semiconductor integrated circuit device comprising: a semiconductor substrate having a principal surface; a MISFET formed on said principal surface of said semiconductor substrate; a silicon nitride film formed on said MISFET; a first insulating film formed on said silicon nitride film and showing an n etching rate different from said silicon nitride film; a first contact hole formed through said first insulating film and said silicon nitride film; a first conductor film formed in said first contact hole and electrically connected to either of said source/drain of said MISFET; a capacitive element formed on said first insulating film and electrically connected to either of said source/drain by way of said first conductor film; and a first metal wire formed on said capacitive element with a second insulating film interposed therebetween;

each of said first insulating and said second insulating film including an insulating film formed by applying a liquid substance containing a polymer of silicon, oxygen and hydrogen as principal ingredient; and the relative dielectric constant of said second insulating film being lower than that of said first insulating film.

(12) A semiconductor integrated circuit device as set forth in (11), wherein the surface of said first insulating is planarized by polishing.

(13) A semiconductor integrated circuit device as set forth in (11), wherein said capacitive element comprises a capacitive insulating film, which includes a film containing high dielectrics or ferroelectrics having a perovskite crystal structure or a complex perovskite crystal structure as principal ingredient.

(14) A semiconductor integrated circuit device comprising: a semiconductor substrate having a principal surface; a MISFET formed on said principal surface of said semiconductor substrate; a silicon nitride film formed on said MISFET; a first insulating film formed on said silicon nitride film and showing an n etching rate different from said silicon nitride film; a first contact hole formed through said first insulating film and said silicon nitride film; a first conductor film formed in said first contact hole and electrically connected to either of said source/drain of said MISFET; a capacitive element formed on said first insulating film and electrically connected to either of said source/drain by way of said first conductor film; and a first metal wire formed on said capacitive element with a second insulating film interposed therebetween;

said first insulating film including an insulating film formed by applying a liquid substance containing a polymer of silicon, oxygen and hydrogen as principal ingredient, said second insulating film including an insulating film formed by applying a liquid substance containing a polymer of silicon, nitrogen and hydrogen as principal ingredient, the relative dielectric constant of said second insulating film being lower than that of said first insulating film.

(15) A semiconductor integrated circuit device comprising: a semiconductor substrate having a principal surface; a MISFET formed on said principal surface of said semiconductor substrate; a bit line formed on said MISFET with a first insulating layer interposed therebetween; a capacitive element formed on said bit line with a second insulating film interposed therebetween; and a first metal wire formed on said capacitive element with a third insulating film interposed therebetween;

said bit line being connected to either of said source/drain of said MISFET by way of a first contact hole formed through said first insulating film, said capacitive element being connected to the other of said source/drain by way of a second contact hole formed through said second insulating film and of a third contact hole formed through said first insulating film, each of said first insulating film, said second insulating film and said third insulating film including an insulating film formed by applying a liquid substance containing a polymer of silicon, oxygen and hydrogen as principal ingredient, the relative dielectric constant of said third insulating film being lower than that of said first insulating film and that of said second insulating film.

(16) A semiconductor integrated circuit device as set forth in (15), further comprising a second metal wire formed on said first metal wire with a fourth insulating film interposed therebetween, said fourth insulating film including an insulating film formed by applying a liquid substance containing a polymer of silicon, oxygen and hydrogen as principal ingredient, the relative dielectric constant of said fourth insulating being lower than that of said first insulating film and that of said second insulating film.

(17) A semiconductor integrated circuit device as set forth in (15), wherein said first insulating film comprises a silicon nitride film covering the top and lateral surfaces of the gate electrode of said MISFET and said insulating film formed on said silicon nitride film, and the surface of said first insulating film is planarized by polishing.

(18) A method of manufacturing a semiconductor integrated circuit device comprising the steps of:

(a) forming a silicon nitride film on the principal surface of a semiconductor substrate and subsequently applying a liquid substance containing a polymer of silicon, oxygen and hydrogen as principal ingredient onto said silicon nitride film;

(b) forming an insulating film by subjecting said liquid substance to a first heat treatment, thereby gasifying the solvent thereof; and (c) forming a contact hole through said insulating and said silicon nitride film by etching said insulating with a high etching rate relative to said silicon nitride film and subsequently etching said silicon nitride film.

(19) A method of manufacturing a semiconductor integrated circuit device as set forth in (18), wherein said polymer is hydrosilsesquioxan.

(20) A method of manufacturing a semiconductor integrated circuit device as set forth in (18), wherein, after having been subjected to said first heat treatment, said insulating film is subjected to a second heat treatment at temperature higher than said first heat treatment prior to said step of etching said insulating film.

(21) A method of manufacturing a semiconductor integrated circuit device comprising steps of:
(a) forming a semiconductor region on the surface of a semiconductor substrate and subsequently applying a liquid substance containing a polymer of silicon, oxygen and hydrogen as principal ingredient onto said semiconductor region;
(b) forming an insulating film by subjecting said liquid substance to a first heat treatment, thereby gasifying the solvent thereof;
(c) subjecting said insulating film to a second heat treatment and subsequently forming a contact hole by drying etching said insulating film; and
(d) forming a conductor layer electrically connected to said semiconductor region in said contact hole.

(22) A method of manufacturing a semiconductor integrated circuit device as set forth in (21), wherein the temperature of said second heat treatment is higher than that of said first heat treatment.

(23) A method of manufacturing a semiconductor integrated circuit device comprising steps of:
(a) forming a first insulating film by applying a liquid substance containing a polymer of silicon, oxygen and hydrogen as principal ingredient onto the principal surface of a semiconductor substrate and subsequently subjecting said liquid substance to a first heat treatment, thereby gasifying the solvent thereof;
(b) subjecting said first insulating film to a second heat treatment in an oxygen-containing atmosphere and subsequently chemically and mechanically polishing the surface of said first insulating film;
(c) forming a conductor member by forming a conductor film on said first insulating film and subsequently by etching said conductor film; and
(d) forming a second insulating film on said conductor member.

(24) A method of manufacturing a semiconductor integrated circuit device as set forth in (23), wherein the relative dielectric constant of said second insulating film is lower than that of said first insulating film.

(25) A method of manufacturing a semiconductor integrated circuit device as set forth in (23), wherein the hydrogen content of said second insulating film is higher than that of said first insulating film.

(26) A method of manufacturing a semiconductor integrated circuit device as set forth in (23), wherein said second insulating film is formed by applying a liquid substance containing a polymer of silicon, oxygen and hydrogen as principal ingredient onto said conductor member and subsequently by subjecting said liquid substance to a first heat treatment, thereby gasifying the solvent thereof.

(27) A method of manufacturing a semiconductor integrated circuit device comprising steps of:
(a) forming a plurality of first conductor members on the principal surface of a semiconductor substrate and subsequently applying a liquid substance containing a polymer of silicon, oxygen and hydrogen as principal ingredient into a space between said first conductor members and also onto said first conductor members;
(b) forming an insulating film by subjecting said liquid substance to a first heat treatment, thereby gasifying the solvent thereof, and subsequently subjecting it to a second heat treatment in an oxygen-containing atmosphere;
(c) forming a capacitive element including a first electrode, a capacitive insulating film and a second electrode on said insulating film.

(28) A method of manufacturing a semiconductor integrated circuit device as set forth in (27), wherein the temperature of said second heat treatment is higher than that of said first heat treatment.

(29) A method of manufacturing a semiconductor integrated circuit device as set forth in (27), wherein the temperature of said second heat treatment is higher than the temperature for forming said capacitive insulating film of said capacitive element.

(30) A method of manufacturing a semiconductor integrated circuit device as set forth in (27), wherein said capacitive insulating film of said capacitive element includes a film containing high dielectrics or ferroelectrics having a perovskite crystal structure or a complex perovskite crystal structure as principal ingredient.

(31) A method of manufacturing a semiconductor integrated circuit device comprising steps of:
(a) forming a plurality of first conductor members on the principal surface of a semiconductor substrate and subsequently applying a first liquid substance containing a polymer of silicon, oxygen and hydrogen as principal ingredient into a space between said first conductor members and also onto said first conductor members;
(b) forming a first insulating film by subjecting said liquid substance to a first heat treatment, thereby gasifying the solvent thereof, and subsequently subjecting it to a second heat treatment in an oxygen-containing atmosphere;
(c) forming a capacitive element including a first electrode, a capacitive insulating film and a second electrode on said first insulating film and subsequently applying a second liquid substance containing a polymer of silicon, oxygen and hydrogen as principal ingredient onto said capacitive element;
(d) forming a second insulating film by subjecting said second liquid substance to a third heat treatment, thereby gasifying the solvent thereof.

(32) A method of manufacturing a semiconductor integrated circuit device as set forth in (31), wherein said polymer is hydrosilsesquioxan.

(33) A method of manufacturing a semiconductor integrated circuit device as set forth in (31), wherein the temperature of said second heat treatment is higher than that of said first heat treatment and that of said third heat treatment.

(34) A method of manufacturing a semiconductor integrated circuit device as set forth in (31), wherein the temperature of said second heat treatment is higher than the temperature for forming said capacitive insulating film of said capacitive element.

(35) A method of manufacturing a semiconductor integrated circuit device as set forth in (31), wherein the relative dielectric constant of said second insulating film is lower than that of said first insulating film.

(36) A method of manufacturing a semiconductor integrated circuit device as set forth in (31), wherein said step of forming said capacitive element on said first insulating film includes a step of forming a third insulating film on said first insulating film by CVD, a step of forming a groove in said third insulating film and a step of forming said capacitive element in said groove.

(37) A method of manufacturing a semiconductor integrated circuit device comprising a step of forming a MISFET on the principal surface of a semiconductor substrate and subsequently forming a first insulating film on said MISFET and a step of forming a capacitive element including a first electrode, a capacitive insulating film and a second electrode on said first insulating film and subsequently forming a second insulating film on said capacitive element; each of said first insulating and said second insulating film including an insulating film formed by applying a liquid substance containing a polymer of silicon, oxygen and hydrogen as principal ingredient; and the relative dielectric constant of said second insulating film being lower than that of said first insulating film.

(38) A method of manufacturing a semiconductor integrated circuit device as set forth in (37), wherein the surface of said first insulating film is planarized by chemical and mechanical polishing.

(39) A method of manufacturing a semiconductor integrated circuit device as set forth in (37), wherein the hydrogen content of said second insulating film is higher than that of said first insulating film.

(40) A method of manufacturing a semiconductor integrated circuit device as set forth in (37), further comprising a step of forming a first metal wire on said second insulating film and forming a second metal wire on said first metal wire with a third insulating film interposed therebetween, said third insulating film including an insulating film formed by applying a liquid substance containing a polymer of silicon, oxygen and hydrogen as principal ingredient, the relative dielectric constant of said third insulating film being lower than that of said first insulating film.

(41) A method of manufacturing a semiconductor integrated circuit device comprising steps of:
(a) forming a MISFET on the principal surface of a semiconductor substrate and subsequently applying a first liquid substance containing a polymer of silicon, oxygen and hydrogen as principal ingredient;
(b) forming a first insulating film by subjecting said first liquid substance to a first heat treatment and subsequently subjecting said first insulating film to a second heat treatment to be conducted at temperature higher than said first heat treatment in an oxygen-containing atmosphere;
(c) forming a metal wire containing aluminum (Al) as principal ingredient on said first insulating film and subsequently applying a second liquid substance containing a polymer of silicon, oxygen and hydrogen as principal ingredient onto said metal wire; and
(d) forming a second insulating film by subjecting said second liquid substance to a third heat treatment to be conducted at temperature lower than said second heat treatment.

(42) A method of manufacturing a semiconductor integrated circuit device as set forth in (41), wherein the relative dielectric constant of said second insulating film is lower than that of said first insulating film.

(43) A method of manufacturing a semiconductor integrated circuit device as set forth in (41), wherein the temperature of said third heat treatment is lower than that of degrading said metal wire.

(44) A method of manufacturing a semiconductor integrated circuit device as set forth in (41), further comprising a step of planarizing the surface of said first insulating film by chemical and mechanical polishing to be conducted after said step (b).

(45) A method of manufacturing a semiconductor integrated circuit device as set forth in (41), further comprising:
(e) a step of irradiating ultraviolet rays to the surface of said second insulating film in an oxygen-containing atmosphere to be conducted after said step (d);
(f) a step of applying a third liquid substance containing a polymer of silicon, oxygen and hydrogen as principal ingredient to the surface of said second insulating film irradiated with ultraviolet rays; and
(g) a step of raising the height of said second insulating film by subjecting said third liquid substance to a fourth heat treatment.

(46) A method of manufacturing a semiconductor integrated circuit device comprising steps of:
(a) forming a MISFET on the principal surface of a semiconductor substrate and subsequently applying a first liquid substance containing a polymer of silicon, oxygen and hydrogen as principal ingredient onto said MISFET;
(b) forming a first insulating film by subjecting said first liquid substance to a first heat treatment and subsequently subjecting said first insulating film to a second heat treatment to be conducted at temperature higher than said first heat treatment in an oxygen-containing atmosphere;
(c) forming a capacitive element on said first insulating film and subsequently applying a second liquid substance containing a polymer of silicon, oxygen and hydrogen as principal ingredient onto said capacitive element; and
(d) forming a second insulating film by subjecting said second liquid substance to a third heat treatment to be conducted at temperature lower than said second heat treatment.

(47) A method of manufacturing a semiconductor integrated circuit device as set forth in (46), wherein the temperature of said third heat treatment is lower than that of degrading said capacitive insulating film of said capacitive element.

(48) A method of manufacturing a semiconductor integrated circuit device comprising steps of:
(a) forming a groove on the element isolating region of the principal surface of a semiconductor substrate and subsequently applying liquid substance containing a polymer of silicon, oxygen and hydrogen as principal ingredient onto said semiconductor substrate including the inside portion of said groove;
(b) forming an insulating film by subjecting said liquid substance to a first heat treatment and subsequently subjecting said insulating film to a second heat treatment to be conducted at temperature higher than said first heat treatment in an oxygen-containing atmosphere; and
(c) forming an element isolating groove on the principal surface of said semiconductor substrate by chemically and mechanically polishing said insulating film subjected to said second heat treatment, leaving said insulating film in the inside portion of said groove.

(49) A method of manufacturing a semiconductor integrated circuit device as set forth in (48), wherein said polymer is hydrosilsesquioxan.

According to the invention, it is now possible to realize a self align contact with ease because an insulating film showing a high etching rate relative to a silicon nitride film can be prepared by forming said insulating film on a MISFET, using a polymer not containing nitrogen as raw material.

According to the invention, it is now possible to use a CMP technique to an insulating film formed by applying a polymer substance because the density of the formed film can be raised by subjecting it to a heat treatment at high temperature.

According to the invention, the inter-wire parasitic capacitance can be reduced by using an insulating film showing a low dielectric constant for the interlayer insulating film to be arranged between wires.

According to the invention, it is now possible to reduce the cost of manufacturing a semiconductor integrated circuit device by using an insulating film formed by applying a polymer substance that is less expensive than an insulating film formed by CVD.

According to the invention, it is now possible to obtain an insulating film practically not containing hydrogen by subjecting a film formed by applying a polymer substance to a heat treatment at high temperature. Therefore, it is possible to effectively prevent the insulating film from discharging gas.

BRIEF DESCRIPTIONS OF THE DRAWINGS

FIG. 35 a schematic cross sectional view of a principal portion of a substrate, also illustrating the embodiment of method of manufacturing a semiconductor integrated circuit device according to the invention.

FIG. 36 a schematic cross sectional view of a principal portion of a substrate, also illustrating the embodiment of method of manufacturing a semiconductor integrated circuit device according to the invention.

Figure 37:
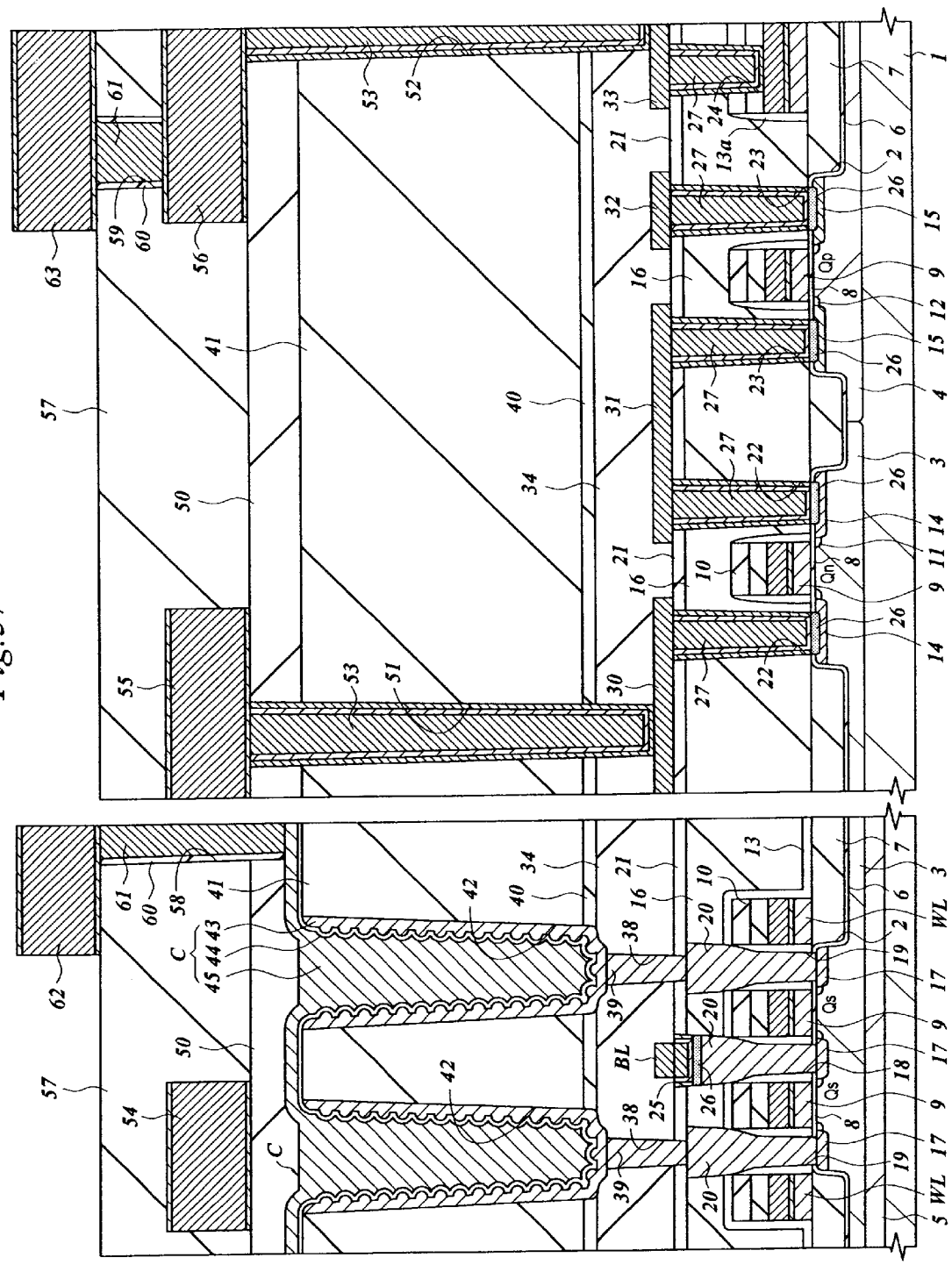

FIG. 37 a schematic cross sectional view of a principal portion of a substrate, also illustrating the embodiment of method of manufacturing a semiconductor integrated circuit device according to the invention.

DESCRIPTIONS OF THE PREFFERRED EMBODIMENTS

Now, the present invention will be described in greater detail by referring to the accompanying drawings that illustrate a preferred embodiment of the invention. Throughout the views of the drawing, the same components are denoted respectively by the same reference symbols and would not be described repeatedly.

The embodiment of method of manufacturing a semiconductor integrated circuit device according to the invention is adapted to manufacture a DRAM (Dynamic Range Access Memory). It will be described below by referring to FIGS. 1 through 37 progressively. Not that, in each view of the drawing illustrating a cross sectional view of the device, a region (memory cell array) where memory cells of the DRAM are formed is shown to the left and a peripheral circuit region is shown to the right.

Figure 1:
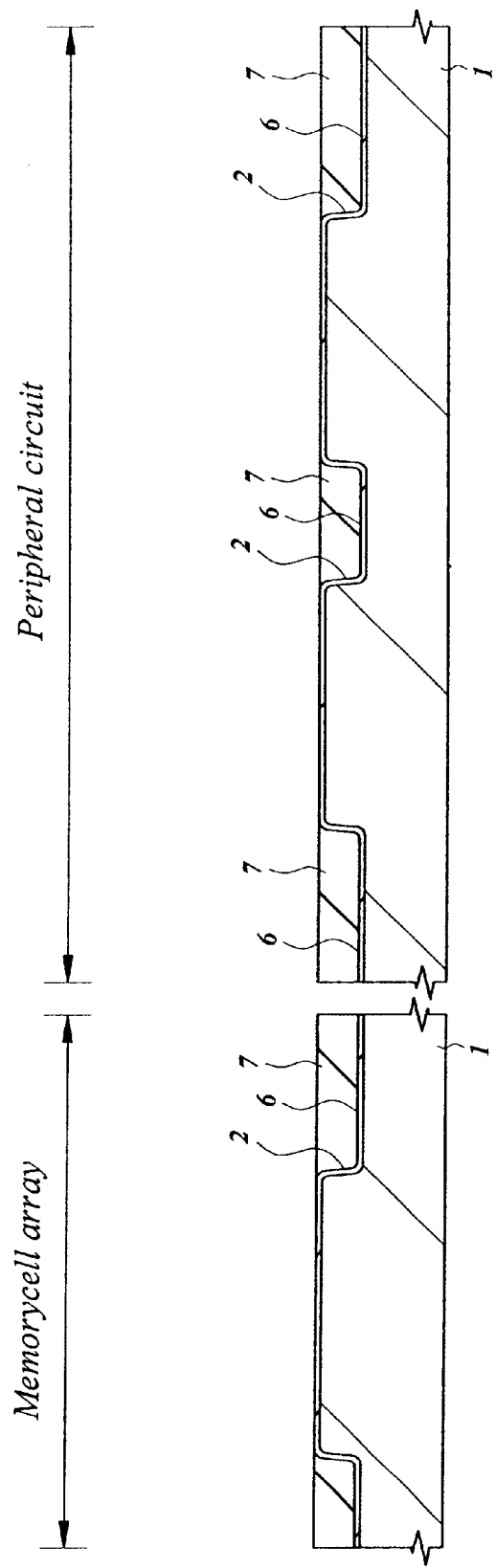
FIG. 1 is a schematic cross sectional view of a principal portion of a substrate, illustrating the embodiment of method of manufacturing a semiconductor integrated circuit device according to the invention.

Firstly, referring to FIG. 1, an element isolating groove 2 is formed in a semiconductor substrate (to be referred to simply as substrate hereinafter) made of p-type single crystal silicon showing a specific resistance between about 1 and 10 Ωcm.

The element isolating groove 2 is produced by etching the element isolating region of the substrate 1 to give rise to a groove having a depth of about 350 nm and subsequently forming a silicon oxide film 6 that is as thin as 10 nm on the inner wall of the groove by thermally oxidizing the substrate 1 at about 1,000° C. The silicon oxide film 6 heals the damage done to the inner wall of the groove during the dry etching operation and reduce the stress that can be generated along the interface of the SOG film 7 to be buried in the groove in the next processing step and the substrate 1.

Then, a liquid substance (chemical solution) containing hydrosilsesquioxan as principal ingredient is applied onto the substrate 1 including the inside of the groove by spin coating and, thereafter, baked at about 90° C. for a minute and subsequently at about 150° C. for another minute. Then, the solvent of the substrate is gasified by heat-treating the applied substance at about 400° C. for 30 minutes (a first heat treatment) in an inert gas atmosphere typically containing nitrogen. As a result, an SOG film is produced as the Si—H bonds thereof are oxidized by about 20 to 30% to produce Si—OH bonds according to the above chemical formula (2).

Since the produced SOG film shows an excellent gap filling effect to a fine space if compared with a silicon oxide film deposited by CVD, it can satisfactorily fill the groove even when the latter has a large aspect ratio.

Then, in this embodiment, said SOG film is subjected to a heat treatment (second heat treatment) conducted at high temperature above 800° C. in an oxygen-containing atmosphere. For the purpose of the present invention, an oxygen-containing atmosphere refers not only to an atmosphere containing oxygen ($O_2$) but also to an atmosphere containing oxidizing gas such as NO or $NO_2$. As a result of this second heat treatment, the reaction of chemical formula (2) goes further and the OH radicals bonded to Si atoms react each other to release water ($H_2O$) and produce an SOG film 7 having a molecular structure as expressed by chemical formula (3) below.

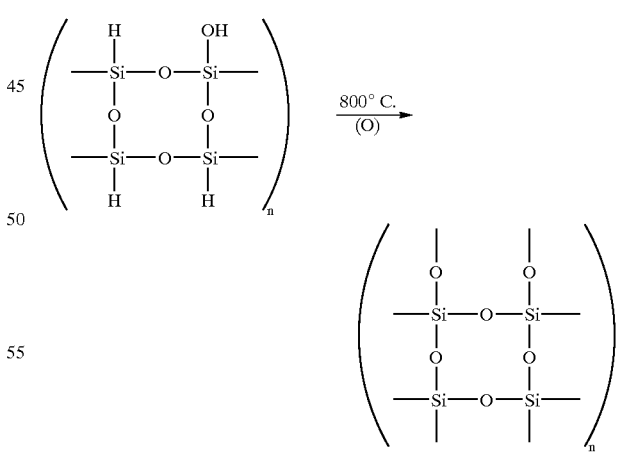

The obtained SOG film 7 does not contain any hydrogen (H) in the molecule except a trace of residual hydrogen and substantially comprises only Si—O—Si bonds to make the film very dense and highly moisture-resistant.

Then, the SOG film 7 is chemically and mechanically polished in an area above the groove to planarize the surface and produce a completed element isolating groove 2.

Figure 2:
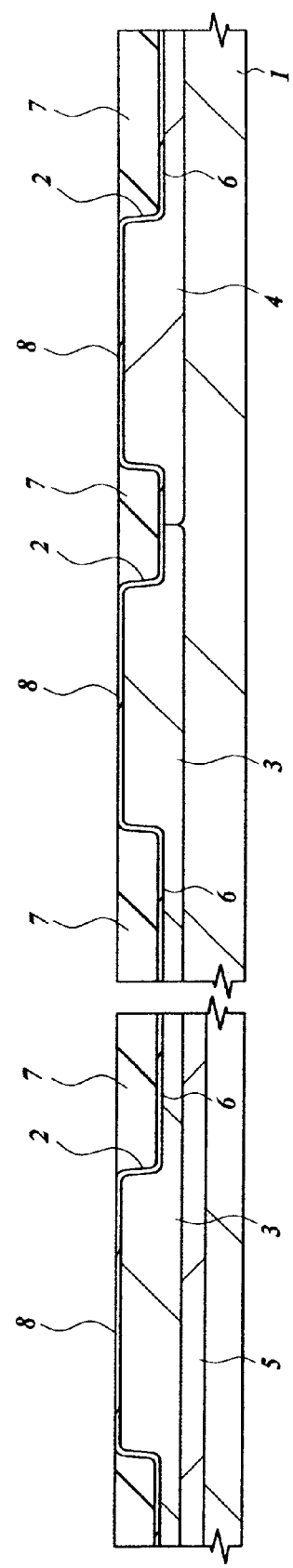
FIG. 2 is a schematic cross sectional view of a principal portion of a substrate, also illustrating the embodiment of method of manufacturing a semiconductor integrated circuit device according to the invention.

Thereafter, as shown in FIG. 2, ions of a p-type impurity substrate (boron) and those of an n-type impurity substance (e.g., phosphor) are implanted into the substrate 1 and subsequently the impurities are made to diffuse in a heat treatment process conducted at about 1,000° C. in order to produce a p-type well 3 and an n-type well 5 in the memory cell array and also a p-type well 3 and an n-type well 4 in the peripheral circuit region.

Then, the surface of the substrate 1 (the p-type well 3 and the n-type well 4) is wet-cleaned by means of a cleaning solution containing hydrofluoric acid and subsequently an about 6 nm thick clean gate oxide film 8 is formed on the surface of the p-type well 3 and that of the n-type well 4 by means of a thermal oxidation process conducted at about 800° C. The gate oxide film 8 may partly comprise a silicon oxide nitride film containing silicon oxide. A silicon oxide nitride film can effectively suppress any generation of a high interface energy level and reduce electron traps when compared with a silicon oxide film so that it can improve the resistance against hot carriers of the gate oxide film 8. A silicon oxide nitride film can typically be formed by thermally oxidizing the substrate 1 in an atmosphere containing nitrogen gas that may be NO and/or $No_2$.

Figure 3:
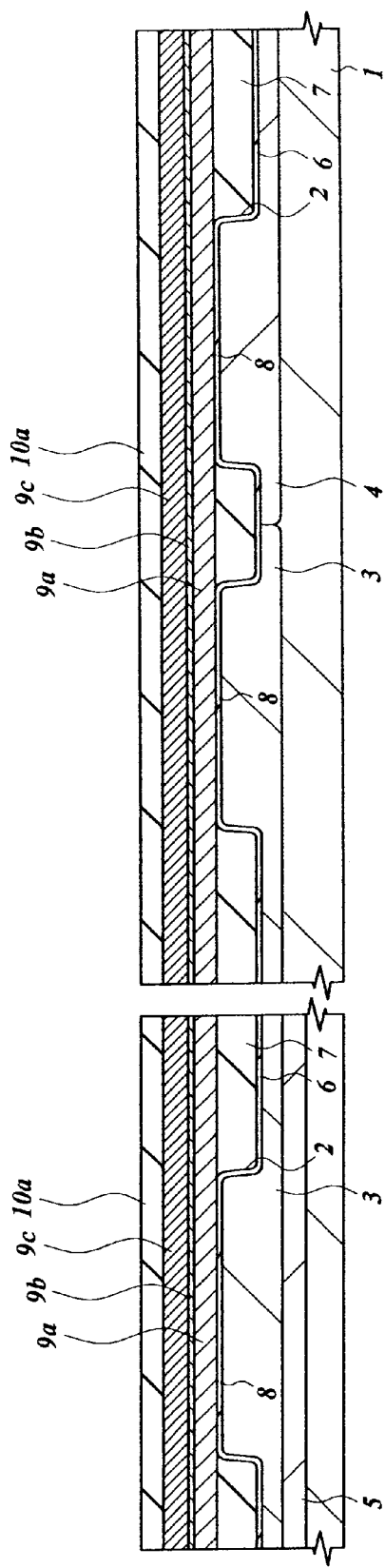
FIG. 3 is a schematic cross sectional view of a principal portion of a substrate, also illustrating the embodiment of method of manufacturing a semiconductor integrated circuit device according to the invention.

Then, as shown in FIG. 3, an about 100 nm thick low resistance polycrystalline silicon film 9a doped with phosphor (P) is deposited on the gate oxide film 8 by CVD and subsequently an about 5 nm thick WN film 9b and an about 50 nm thick W film 9c are sequentially deposited thereon by sputtering. Then, an about 100 nm thick silicon oxide film 10 a is further deposited thereon by CVD.

Thereafter, the film layers are subjected to a heat treatment process conducted at about 800° C. in an inert gas atmosphere typically containing nitrogen in order to reduce the stress of said W film 9c and densify the WN film 9b. Note that the silicon oxide film 10a on the W film 9c is formed to reduce the stress along the interface of the silicon nitride film (10b) to be deposited on the silicon oxide film 10a in the next step and the underlying W film 9c.

Figure 4:
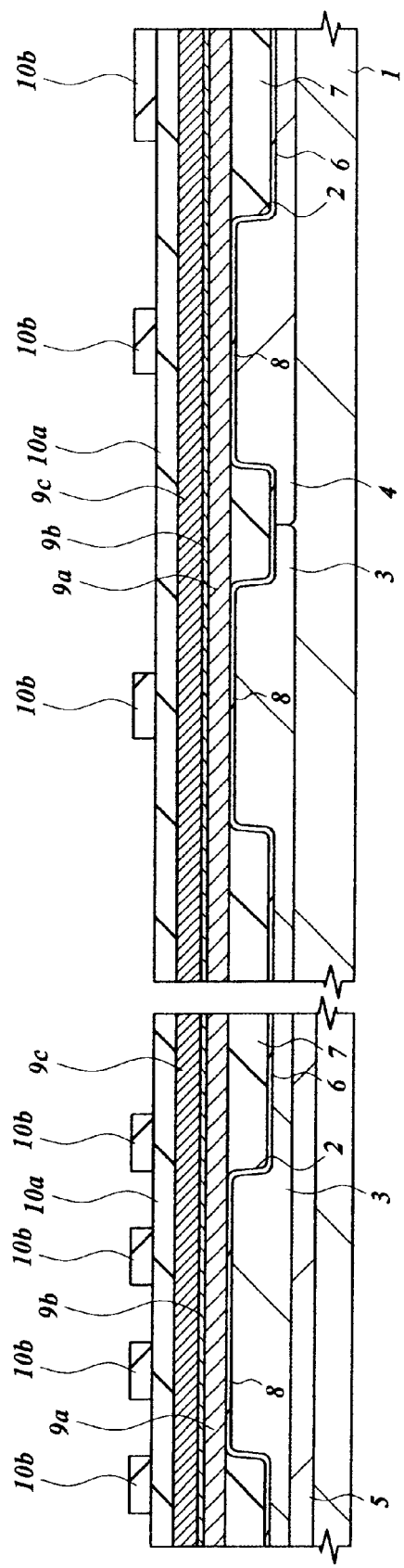
FIG. 4 is a schematic cross sectional view of a principal portion of a substrate, also illustrating the embodiment of method of manufacturing a semiconductor integrated circuit device according to the invention.

Then, as shown in FIG. 4, an about 100 nm thick silicon nitride film 10b is deposited on the silicon oxide film 10a by CVD and subsequently the formed silicon nitride film 10b is etched out by dry-etching, using a photoresist film (not shown) as mask, except the areas where gate electrodes are to be formed.

Figure 5:
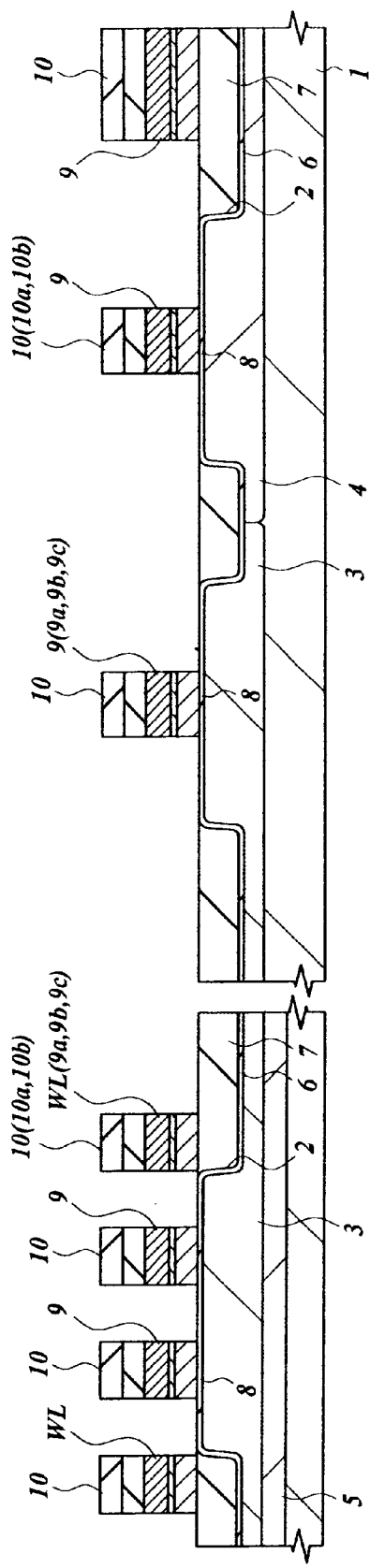
FIG. 5 is a schematic cross sectional view of a principal portion of a substrate, also illustrating the embodiment of method of manufacturing a semiconductor integrated circuit device according to the invention.

After removing the photoresist film, gate electrodes 9, each comprising a polycrystalline silicon film 9a, an WN film 9b, a W film 9c, are formed both in the memory cell array and in the peripheral circuit region as shown in FIG. 5 by dry-etching the silicon oxide film 10a, the W film 9c, the WN film 9b and the polycrystalline silicon film 9a, using the silicon nitride film 10b as mask and then a cap insulating film 10 comprising a silicon oxide film 10a and a silicon nitride film 10b is formed on the gate electrode 9. Note that the gate electrodes 9 formed in the memory cell array operate as word lines WL.

Figure 6:
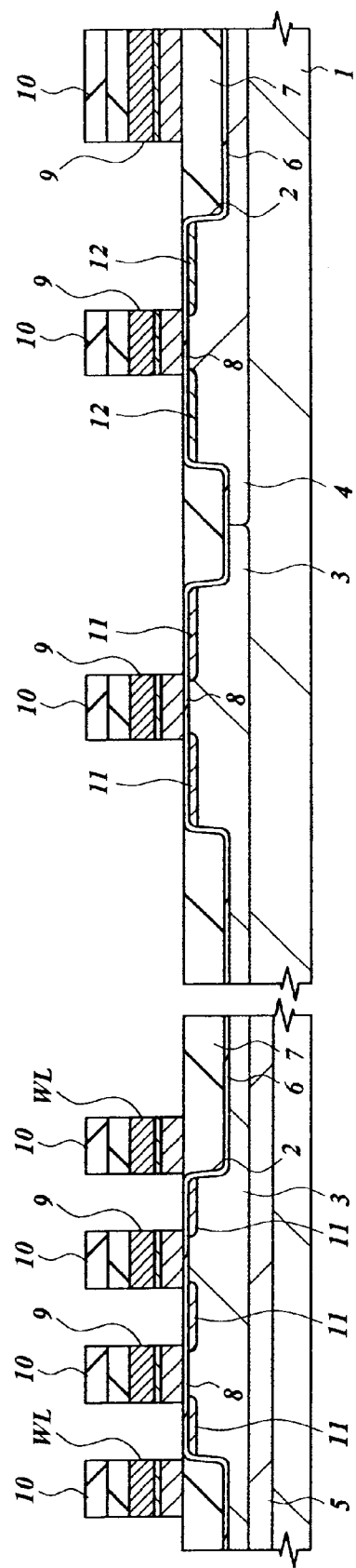
FIG. 6 is a schematic cross sectional view of a principal portion of a substrate, also illustrating the embodiment of method of manufacturing a semiconductor integrated circuit device according to the invention.

Thereafter, as shown in FIG. 6, ions of an n-type impurity substance (phosphor or arsenic) are implanted into the p-type well 3 at the opposite lateral sides of the gate electrodes 9 to produce n-type semiconductor regions 11 and then ions of a p-type impurity substance (boron) are implanted into the n-type well 4 to produce p-type semiconductor regions 12.

Figure 7:
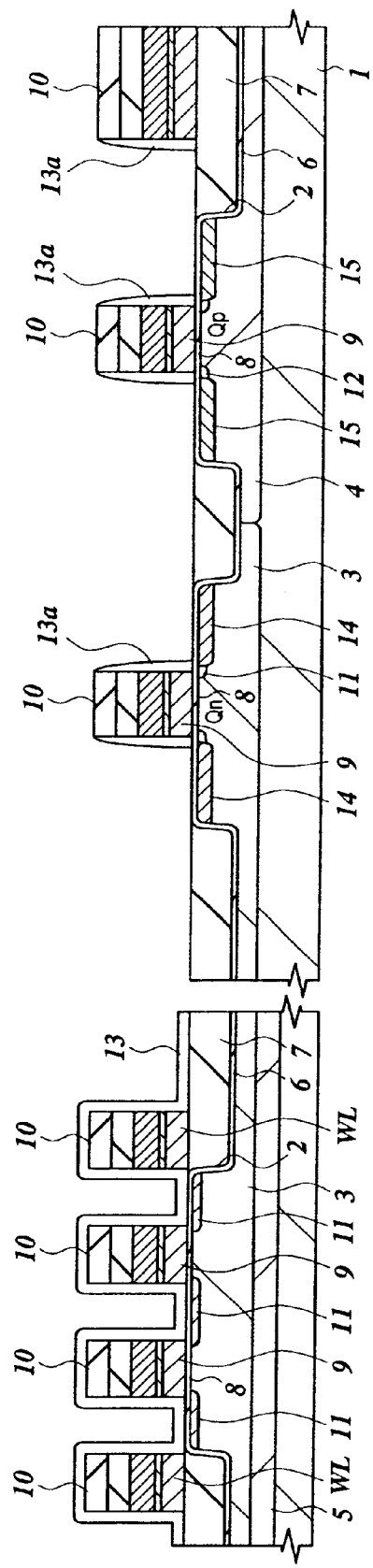
FIG. 7 is a schematic cross sectional view of a principal portion of a substrate, also illustrating the embodiment of method of manufacturing a semiconductor integrated circuit device according to the invention.

Then, as shown in FIG. 7, an about 50 nm thick silicon nitride film 13 is deposited on the substrate 1 by CVD and subsequently side wall spacers 13a are formed on the lateral walls of the gate electrodes 9 in the peripheral circuit region by covering the top of the memory cell array with photoresist (not shown) and anisotropically etching the silicon nitride film 13 in the peripheral circuit region. Then, n+-type semiconductor regions (source/drain regions) 14 are formed by implanting ions of an n-type impurity substance (phosphor or arsenic) in the p-type well 3 of the peripheral circuit region and p+-type semiconductor regions (source/drain regions) are formed by implanting ions of a p-type impurity substance (boron) in the n-type well 4 of the peripheral circuit region. Thus, an n-channel type MISFET Qn and a p-channel type MISFET Qp comprising source/drain regions having an LDD (Lightly Doped Drain) structure are prepared by the above steps.

Figure 8:
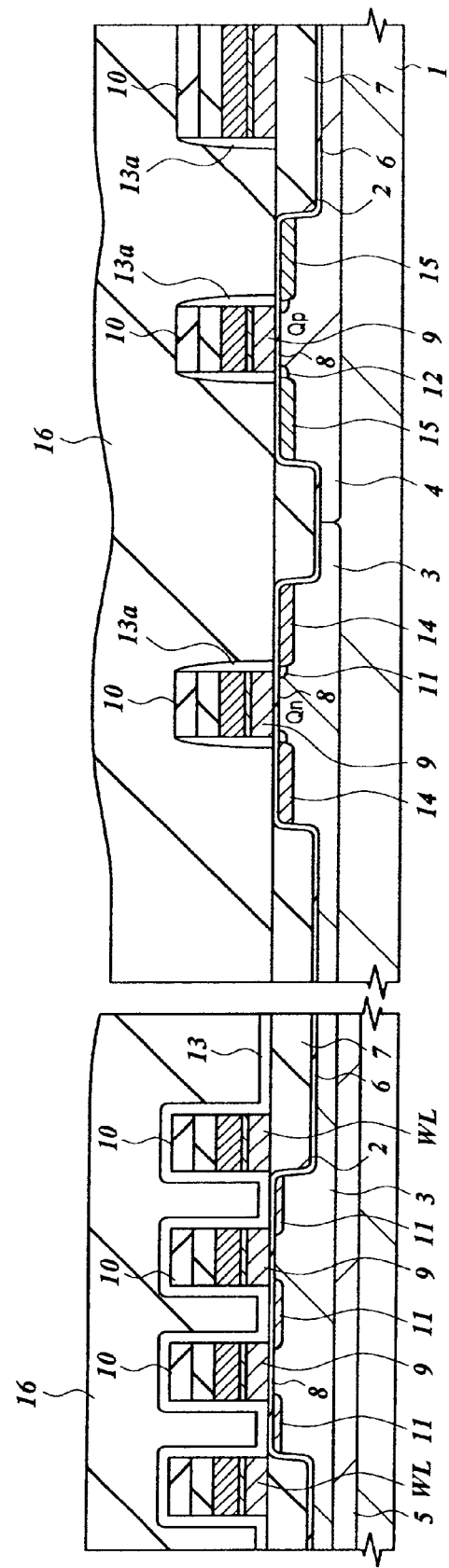
FIG. 8 is a schematic cross sectional view of a principal portion of a substrate, also illustrating the embodiment of method of manufacturing a semiconductor integrated circuit device according to the invention.

Then, as shown in FIG. 8, an SOG film 16 is formed above the gate electrodes 9. More specifically, the SOG film 16 is formed firstly by applying a liquid substance (chemical solution) containing hydrosilsesquioxan as principal ingredient onto the substrate 1 by spin coating. As seen from the chemical formula (2), hydrosilsesquioxan has a molecular structure where oxygen atoms (O) and hydrogen atoms (H) are bonded to a silicon (Si) atom and hence does not contain any nitrogen in the molecule. The molecular weight (n) of hydrosilsesquioxan is between several hundreds and ten thousands and, typically equal to about 2,000. Hydrosilsesquioxan shows a relative dielectric constant approximately between 2.7 and 2.9.

Then, the applied substance is baked at about 90° C. for a minute and then at about 150° C. also for another minute and subsequently the solvent of the solution is gasified by heating it at about 400° C. for 30 minutes (first heat treatment). As a result, a chemical reaction as expressed by formula (2) takes place to oxidize the Si—H bonds by 20 to 30% and produce an SOG film having Si—OH bonds. The obtained SOG film shows a relative dielectric constant approximately between 3.2 and 3.4.

Since the produced SOG film shows an excellent gap filling effect to a fine space if compared with a silicon oxide film deposited by CVD or a BPSG film, it can satisfactorily fill the minute space separating adjacently located gate electrodes 9 (word lines WL).

Then, said SOG film is subjected to a heat treatment (second heat treatment) at about 800° C. for about 5 to 10 minutes in an oxygen-containing atmosphere. As a result, the reaction as expressed by chemical formula (2) proceeds further to encourage the OH radicals bonded to Si atoms to react with each other to release water ($H_2O$) and produce an SOG film 7 having a molecular structure as expressed by chemical formula (3). Note that the obtained SOG film 16 shows a relative dielectric constant approximately between 3.8 and 4.0.

The obtained SOG film 16 does not contain any hydrogen (H) in the molecule except a trace of residual hydrogen and substantially comprises only Si—O—Si bonds to make the film very dense and highly moisture-resistant.

As pointed out above, an SOG film 16 having a structure as expressed by chemical formula (3) is obtained only by heat-treating an SOG film that has been subjected to a heat treatment at about 400° C. again at high temperature not lower than 600° C. in an oxygen-containing atmosphere. For the purpose of the present invention, an oxygen-containing atmosphere refers not only to an atmosphere containing oxygen ($O_2$) but also to an atmosphere containing oxidizing gas such as NO or $NO_2$.

During the above high temperature heat treatment, the steam ($H_2O$) concentration in the atmosphere is preferably as low as possible. Additionally, the high temperature heat treatment should be conducted after a baking process for gasifying and dispelling the solvent because the latter can be fiercely gasified from the chemical solution to generate bubbles in the film if the chemical solution of hydrosilsesquioxan applied to the substrate 1 by spin coating is directly heated to high temperature.

As will be discussed hereinafter, in the process of manufacturing a DRAM, the capacitive insulating film of a capacitive element may be crystallized, fed with oxygen and/or subjected a high temperature heat treatment. If such is the case, the high temperature heat treatment for obtaining a dense SOG film 16 should be conducted at temperature higher than the heat treatment temperature to be conducted in the step of forming the capacitive insulating film. If the high temperature heat treatment for obtaining a dense SOG film 16 is conducted at temperature lower than the heat treatment of the step of forming the capacitive insulating film, gas containing residual hydrogen can be released from the inside of the SOG film 16 during the step of forming the capacitive insulating film to degrade the quality of the SOG film 16. However, on the other hand, if the temperature of the heat treatment for producing a densified SOG film 16 is too high, the impurities introduced in the semiconductor regions of the MISFET can be diffused, if partly, into the substrate 1 to make it impossible to realize a shallow pn junction to by turn give rise to adverse effects including a degraded mutual conductance (Gm) of the MISFET and a fluctuating threshold voltage. Therefore, the heat treatment for producing a densified SOG film 16 is preferably conducted at temperature slightly higher than the temperature of the heat treatment of the step of forming the capacitive insulating film.

Figure 9:
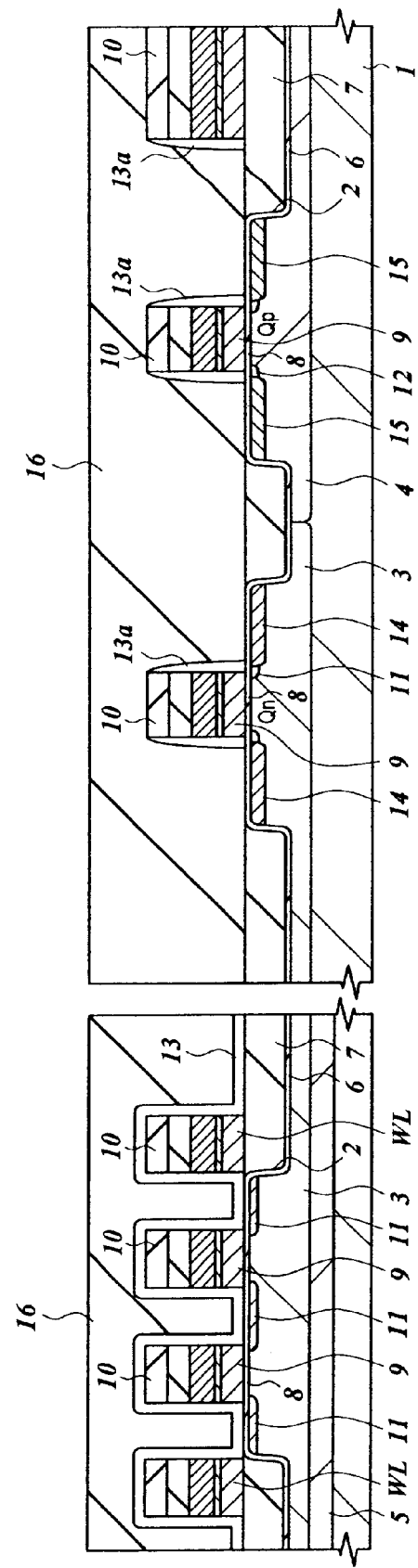
FIG. 9 is a schematic cross sectional view of a principal portion of a substrate, also illustrating the embodiment of method of manufacturing a semiconductor integrated circuit device according to the invention.

Then, as shown in FIG. 9, the surface of the SOG film 16 is planarized by chemical and mechanical polishing. Since an SOG film prepared by way of a heat treatment at about 400° C. is soft relative to a silicon oxide film deposited by means of a CVD technique, it is normally difficult to use CMP to such a film. However, on the other hand, an SOG film 16 heat-treated at high temperature of about 800° C. is as dense as a silicon oxide film deposited by CVD and hence can be subjected to a CMP process. Then, the top of the gate electrodes 9 can be planarized by using a single SOG film 16 to reduce the number of steps necessary for manufacturing a semiconductor integrated circuit device.

Figure 10:
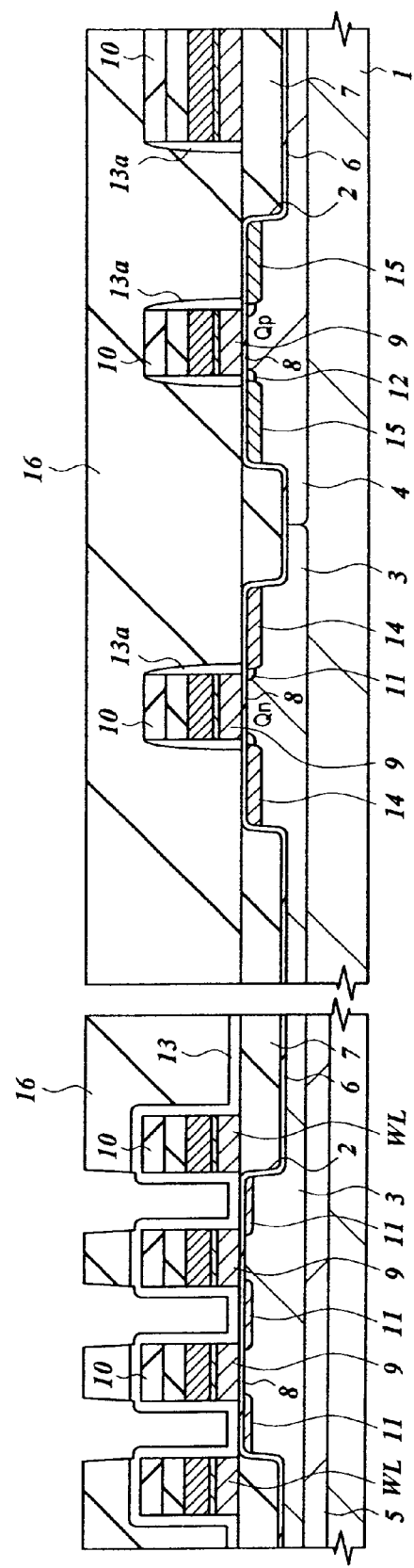
FIG. 10 is a schematic cross sectional view of a principal portion of a substrate, also illustrating the embodiment of method of manufacturing a semiconductor integrated circuit device according to the invention.
Figure 11:
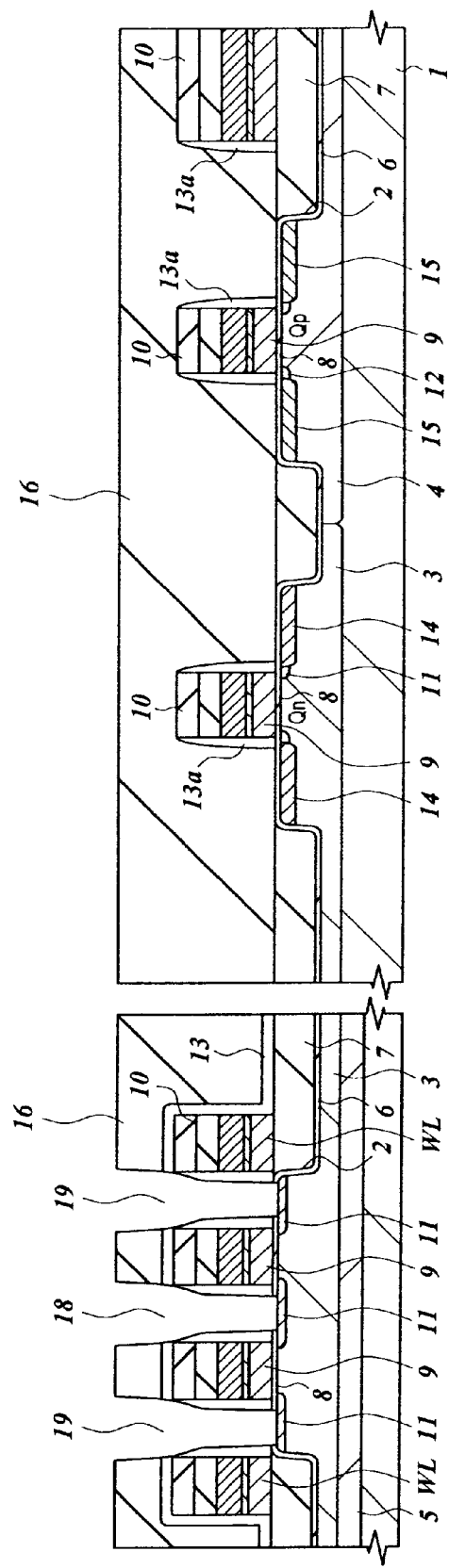
FIG. 11 is a schematic cross sectional view of a principal portion of a substrate, also illustrating the embodiment of method of manufacturing a semiconductor integrated circuit device according to the invention.

Then, as shown in FIG. 10, the SOG film 16 of the memory cell array is etched out by dry etching, using a photoresist film (not shown) as mask. Then, as shown in FIG. 11, contact holes 18, 19 are produced in an upper portion of the n-type semiconductor region 11 by dry etching the silicon nitride film 13 underlying the SOG film 16.

The above operation of etching the SOG film 16 is conducted under a condition that makes the rate of etching silicon oxide (SOG film 16) higher than that of etching silicon nitride so that the silicon nitride film 13 may not be completely removed. Additionally, the operation of etching the silicon nitride film 13 is conducted under a condition that makes the rate of etching silicon nitride higher than that of etching silicon (substrate) and silicon oxide so that neither the substrate 1 nor the SOG film 7 may be scraped off deeply. Still additionally, the operation of etching the silicon nitride film 13 is conducted under a condition that allows the silicon nitride film to be etched anisotropically and hence it may be left on the lateral walls of the gate electrodes 8 (word lines WL). Thereby, contact holes 18 and 19 having a small diameter are formed by self alignment against the gate electrodes 9 (word lines WL).

Figure 12:
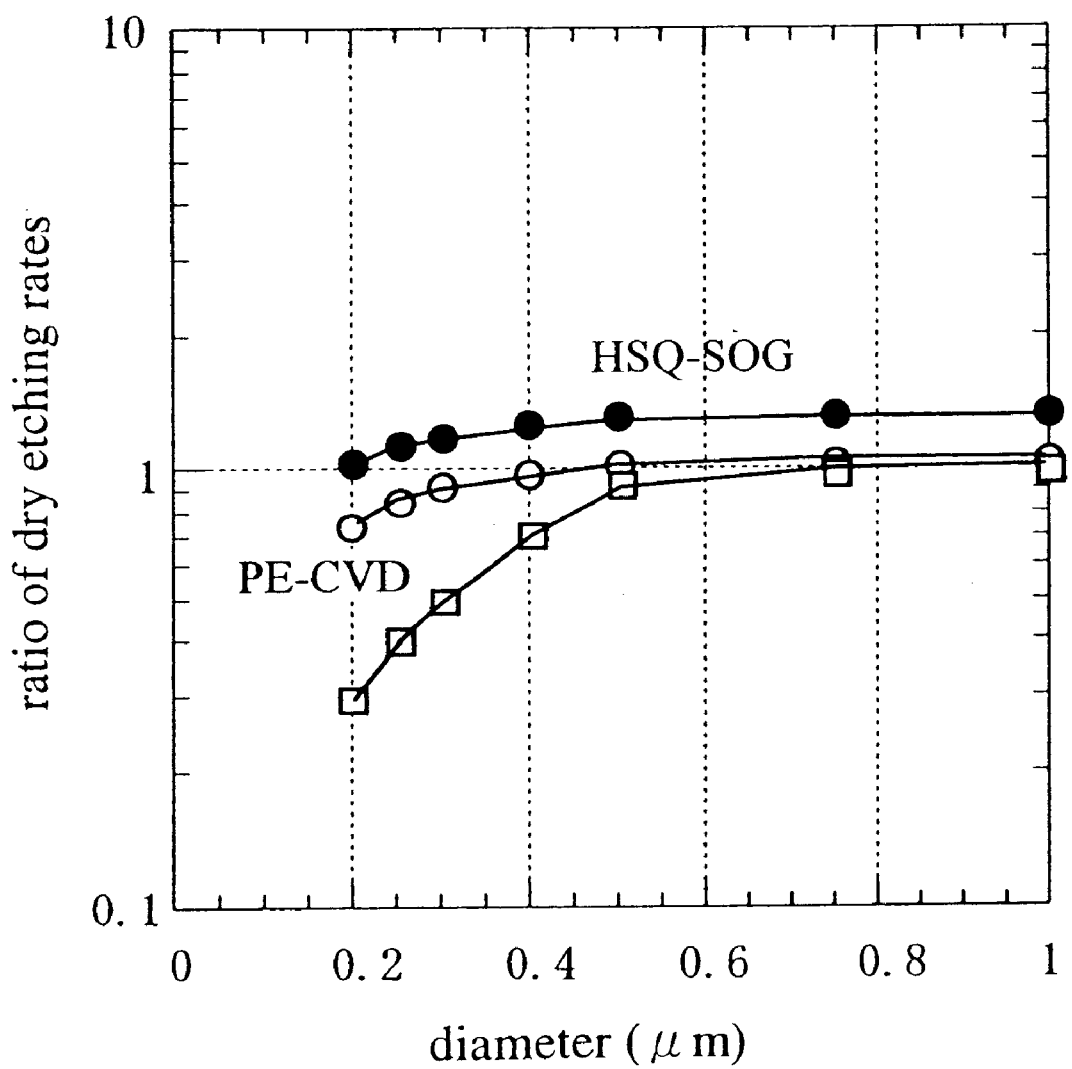
FIG. 12 is a graph illustrating the relationship between the diameter of each of the contact holes formed in three different silicon oxide type insulating films and the ratio of the rate of dry etching each of the insulating films to that of dry etching a silicon nitride film obtained as a result of an experiment.

FIG. 12 is a graph illustrating the relationship between the diameter of each of the contact holes formed in three different silicon oxide type insulating films and the ratio of the rate of dry etching each of the insulating films to that of dry etching a silicon nitride film obtained as a result of an experiment. In FIG. 12, HSQ-SOG denotes an SOG 16 obtained as a result of a heat treatment conducted at high temperature of about 800° C. in an oxygen-containing atmosphere and nitrogen-containing SOG denotes an SOG film obtained from polysilazan, whereas PE-CVD denotes a silicon oxide film deposited by plasma CVD. The ratio of the rate of etching a silicon oxide film relative to that of etching a silicon nitride film is expressed by 1 when a contact hole is formed to a diameter of 1 μm in a silicon oxide film (PE-CVD) deposited by plasma CVD.

As seen from FIG. 12, the SOG film (nitrogen-containing SOG) obtained from polysilazan shows a rapid fall in the ratio of the etching rate relative to that of etching a silicon nitride film to make it very difficult to produce a contact hole when the diameter of the contact hole is reduced because of the nitrogen contained in the molecule. Contrary to this, an SOG film (16) of this embodiment shows a ratio higher than the silicon oxide film (PE-CVD) deposited by plasma CVD so that a contact hole having a diameter less than 0.25 μm can be realized. An SOG film 16 obtained from hydrosilsesquioxan shows a large ratio of the etching rate relative to that of etching a silicon nitride because it does not contain any nitrogen.

Figure 13:
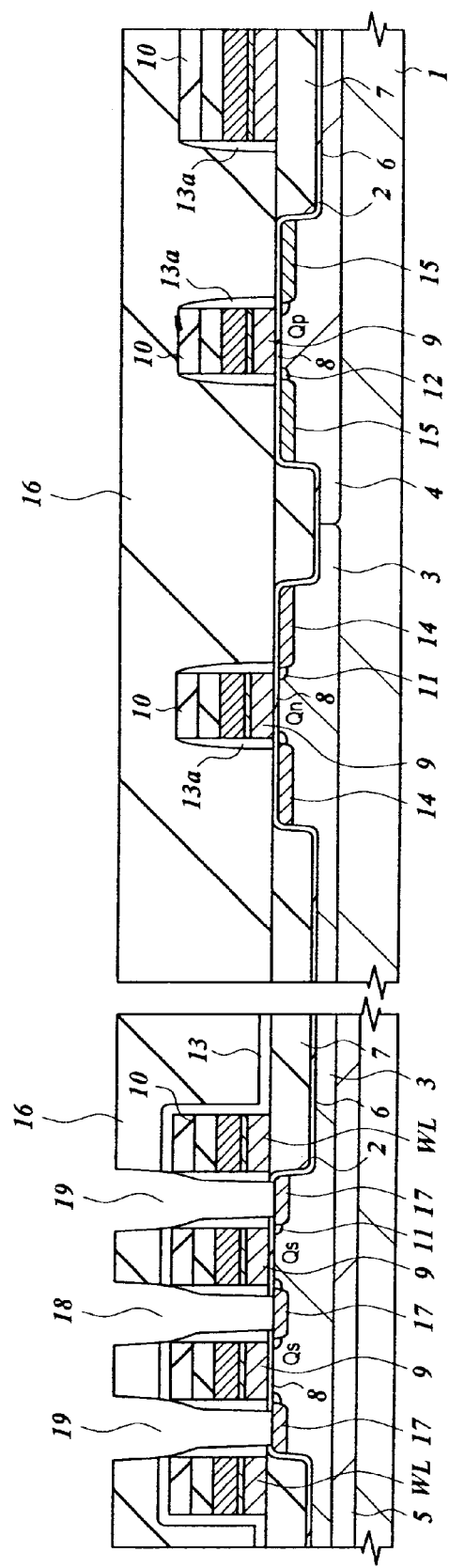
FIG. 13 is a schematic cross sectional view of a principal portion of a substrate, also illustrating the embodiment of method of manufacturing a semiconductor integrated circuit device according to the invention.

Then, as shown in FIG. 13, ions of an n-type impurity substance (phosphor or arsenic) are implanted into the p-type well 3 (n-type semiconductor region 11) by way of the contact holes 18, 19 to produce n+-type semiconductor regions 17 (source/drain regions). An n-type memory selection MISFET Qs is prepared in the memory cell array by the above steps.

Figure 14:
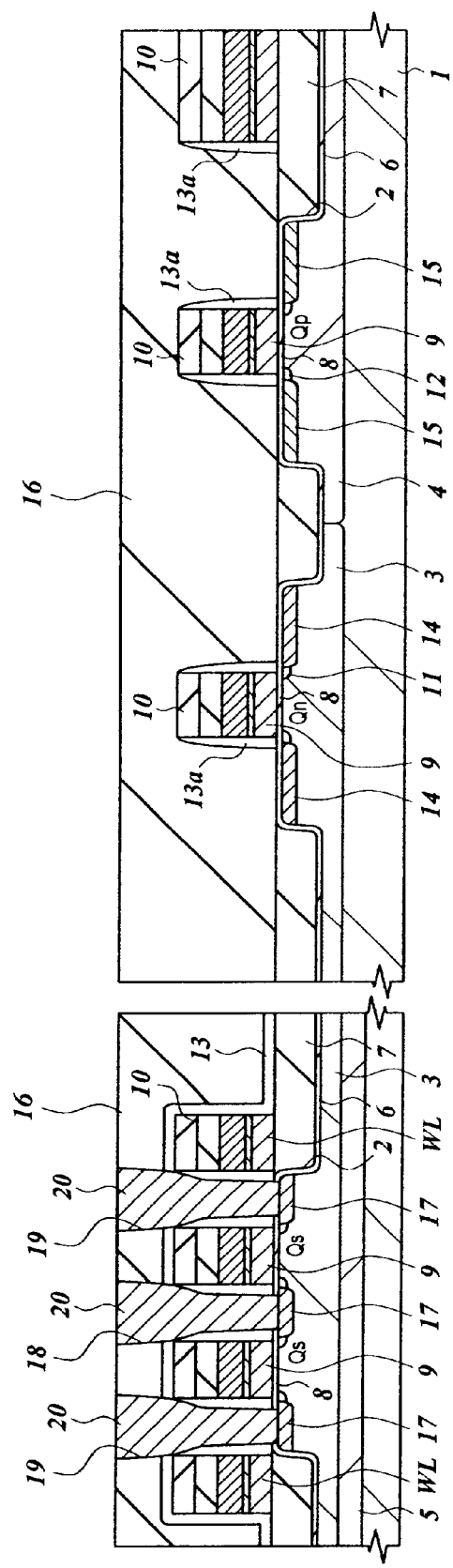
FIG. 14 is a schematic cross sectional view of a principal portion of a substrate, also illustrating the embodiment of method of manufacturing a semiconductor integrated circuit device according to the invention.

Then, as shown in FIG. 14, plugs 20 are formed in the contact holes 18, 19. More specifically, plugs 20 are formed by wet-cleaning the inside of the contact holes 18, 19 by means of a fluorine-containing cleaning solution, subsequently depositing a low resistance polycrystalline silicon film doped with an n-type impurity substance such as phosphor (P) on the SOG film 16 including the contact holes and then etching back the polycrystalline silicon film (by means of CMP) except the inside of the contact holes 18, 19.

Figure 15:
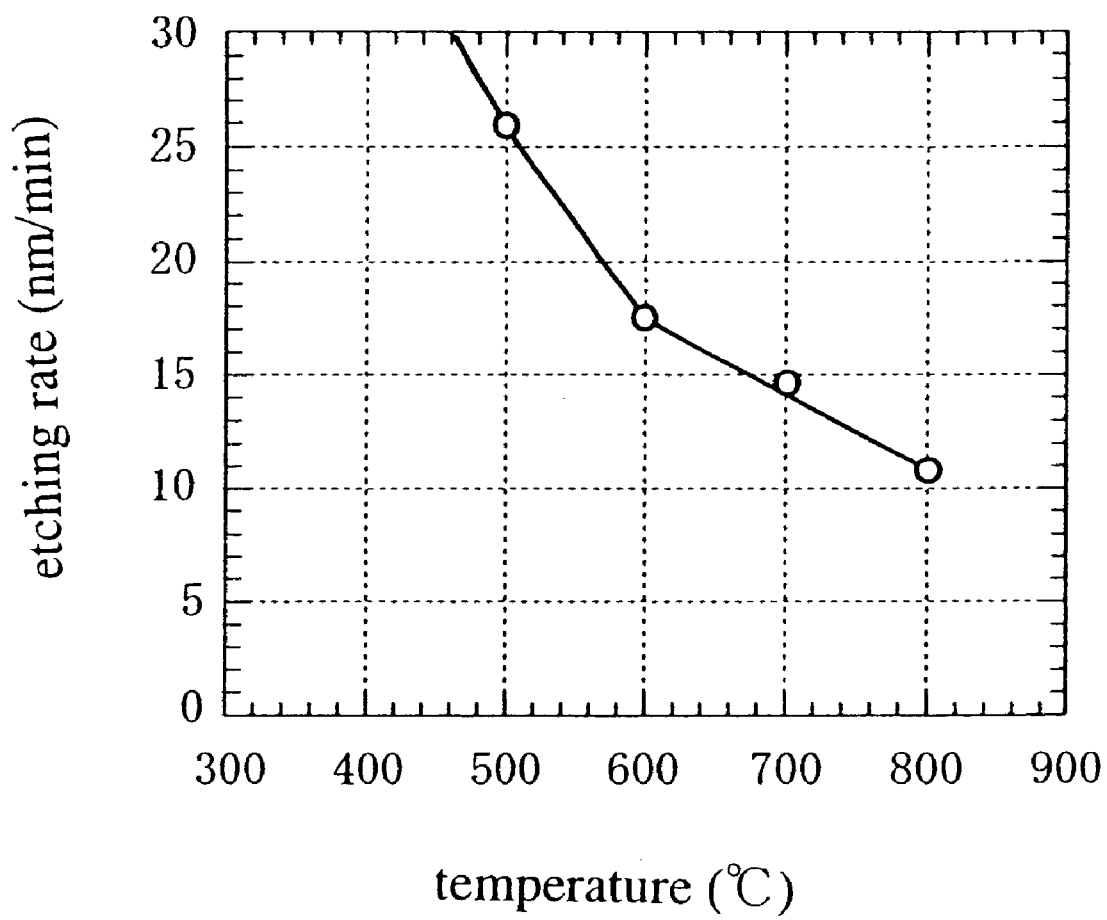
FIG. 15 is a graph illustrating the relationship between the rate of etching an SOG film wet-cleaned with a cleaning solution containing hydrofluoric acid and the heat treatment temperature for forming the SOG film.

FIG. 15 is a graph illustrating the relationship between the rate of etching an SOG film after wet-cleaning the SOG film with a cleaning solution containing hydrofluoric acid by 0.5% and the heat treatment temperature required for producing the SOG film. As seen from FIG. 15, an SOG film simply subjected to a heat treatment at about 400° C. (baking process) shows a contact hole having its diameter remarkably increased as a result of wet-cleaning the inside thereof because it provides a very high etching rate so that the plugs formed in adjacent contact holes can become electrically leaky and/or short-circuited.

On the other hand, an SOG film subjected to a high temperature heat treatment at about 800° C. shows a contact hole having its diameter increased only slightly because of a relatively low etching rate. Thus, when an SOG film of hydrosilsesquioxan is formed on the gate electrodes 9 and heat treated at high temperature of about 800° C. to densify it, the plugs 20 formed in adjacent contact holes 18, 19 are successfully prevented from becoming electrically leaky and/or short-circuited.

Figure 16:
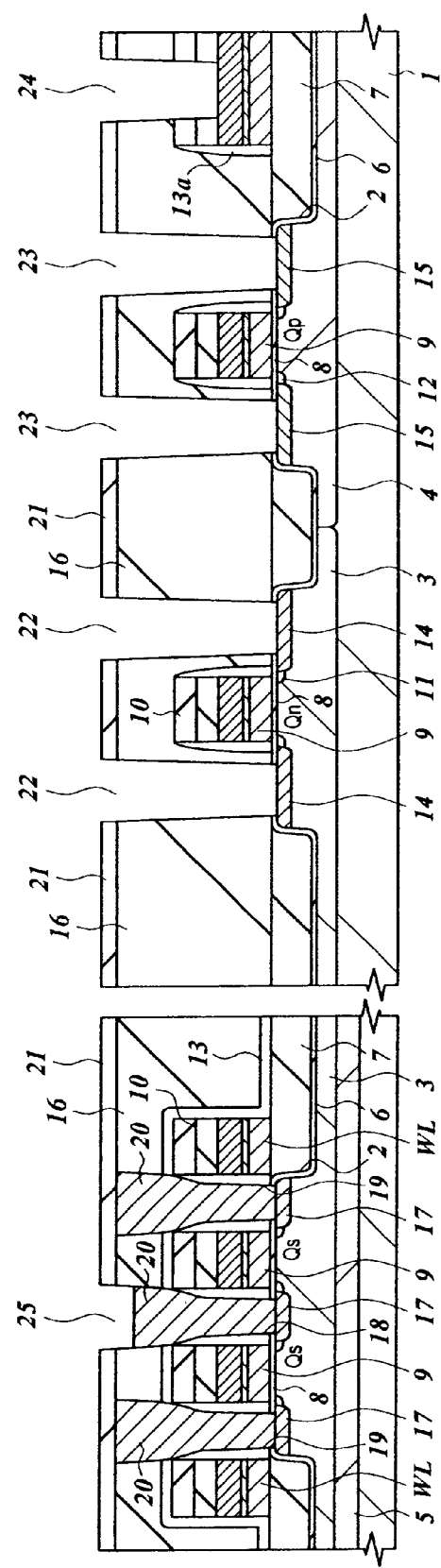
FIG. 16 is a schematic cross sectional view of a principal portion of a substrate, also illustrating the embodiment of method of manufacturing a semiconductor integrated circuit device according to the invention.

Then, as shown in FIG. 16, an about 20 nm thick silicon oxide film 21 is deposited on the SOG film 16 by means of CVD and subsequently the silicon oxide film 21 and the underlying SOG film 16 is dry-etched from the peripheral circuit region by using a photoresist film (not shown) as mask to produce contact holes 22 on the source/drain (n+-type semiconductor region 14) of the n-channel type MISFET Qn and also contact holes 23 on the source/drain (p+-type semiconductor region 15) of the p-channel type MISFET Qp. At the same time, a contact hole 24 is formed on the gate electrode 9 of the p-channel type MISFET Qp in the peripheral circuit region (and also on the gate electrode 9 of the n-channel type MISFET Qp in a region not shown). A through hole is also formed above the contact hole 18 in the memory cell array.

Figure 17:
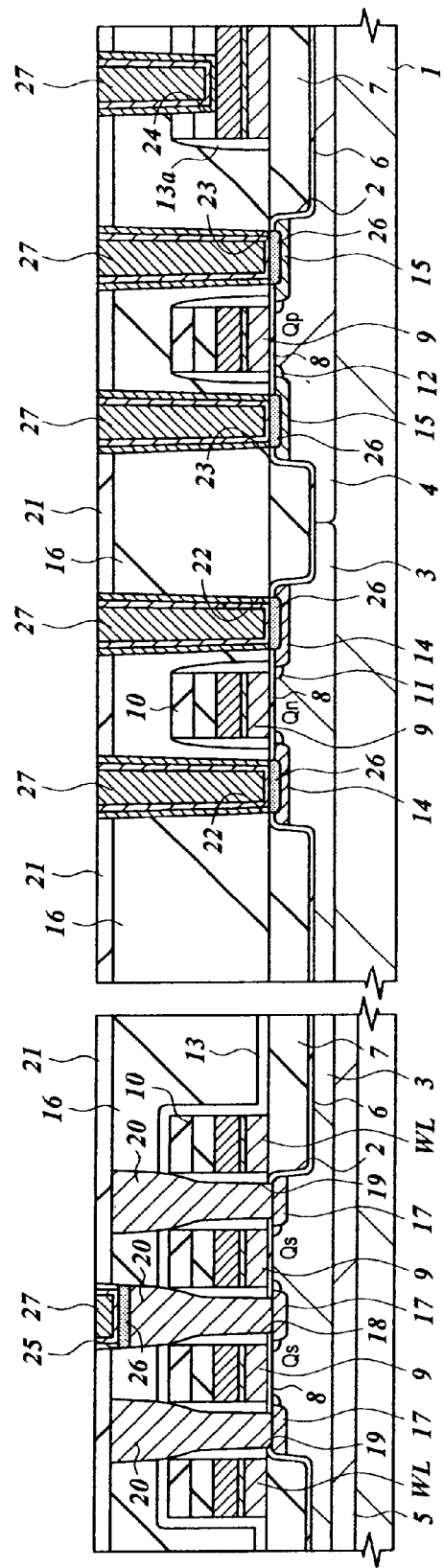
FIG. 17 is a schematic cross sectional view of a principal portion of a substrate, also illustrating the embodiment of method of manufacturing a semiconductor integrated circuit device according to the invention.

Then, as shown in FIG. 17, a silicide film is formed on the surface of the source/drain (n+-type semiconductor region 14) of the n-channel type MISFET Qn, that of the source/drain (n+-type semiconductor region 15) of the p-channel type MISFET Qp and that of the plugs 20 in the contact holes 18 and subsequently plugs 27 are formed in the respective contact holes 22, 23, 24.

More specifically, the above silicide film 26 is formed typically by depositing an about 30 nm thick Ti film and an about 20 nm thick TiN film on the silicon oxide film 21 including the inside of the contact holes 22, 23, 24 and also the inside of the through hole 25 by sputtering and then heat-treating the substrate 1 at about 650° C. The plug 27 is formed by depositing an about 50 nm thick TiN film and an about 300 nm thick W film on the above TiN film including the inside of the contact holes 22, 23, 24 and also the inside of the through hole 25 by CVD and then polishing the W film, the TiN film and the Ti film on the silicon oxide film 21 until the films are completely removed except the inside of the contact holes 22, 23, 24 and the through hold 25.

The operation speed of the MISFETs (n-channel type MISFET Qn, p-channel type MISFET Qp) of the peripheral circuit is improved as the contact resistance of the source/drain regions (n+-type semiconductor region 14, p+-type semiconductor region 15) and the plug 27 is reduced by forming the silicide film 26, which is a Ti silicide film, along the interface of the source/drain regions (n+-type semiconductor region 14, p+-type semiconductor region 15) and the plug 27 formed thereon.

Figure 18:
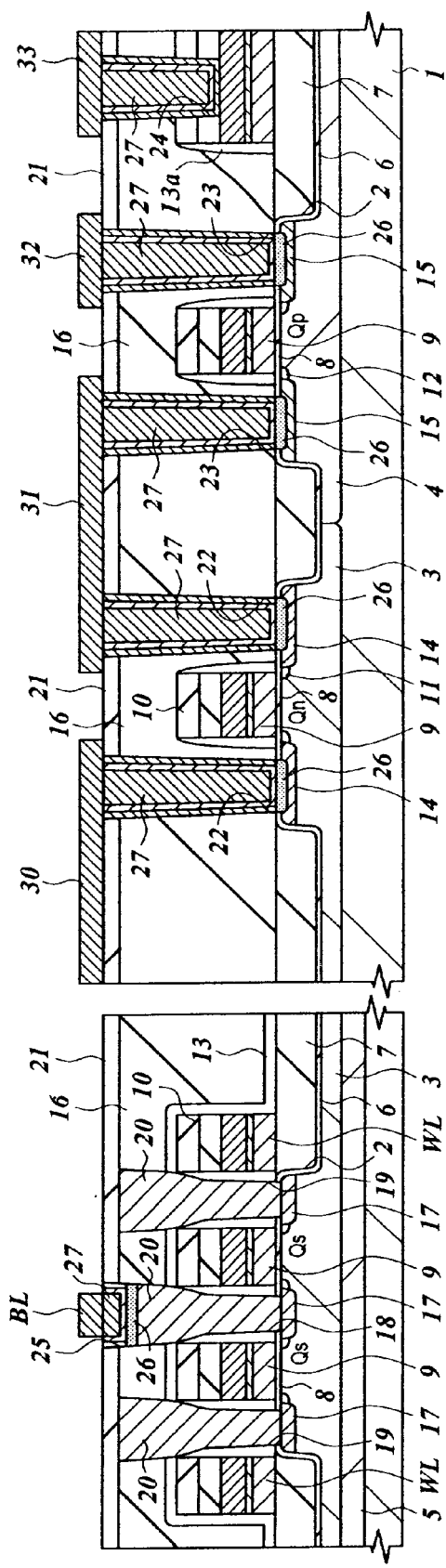
FIG. 18 is a schematic cross sectional view of a principal portion of a substrate, also illustrating the embodiment of method of manufacturing a semiconductor integrated circuit device according to the invention.

Then, as shown in FIG. 18, a bit line BL is formed on the silicon oxide film 21 of the memory cell array and first layer wires 30 through 33 are formed on the silicon oxide film 21 on the peripheral circuit region. More specifically, the bit line BL and the first layer wires 30 through 33 are formed typically by depositing an about 100 nm thick W film on the silicon oxide film 21 by sputtering and dry etching the W film, using a photoresist film as mask. Since the SOG film 16 underlying the bit line BL and the wires 30 through 33 is planarized, they can be patterned with an enhanced level of precision.

Figure 19:
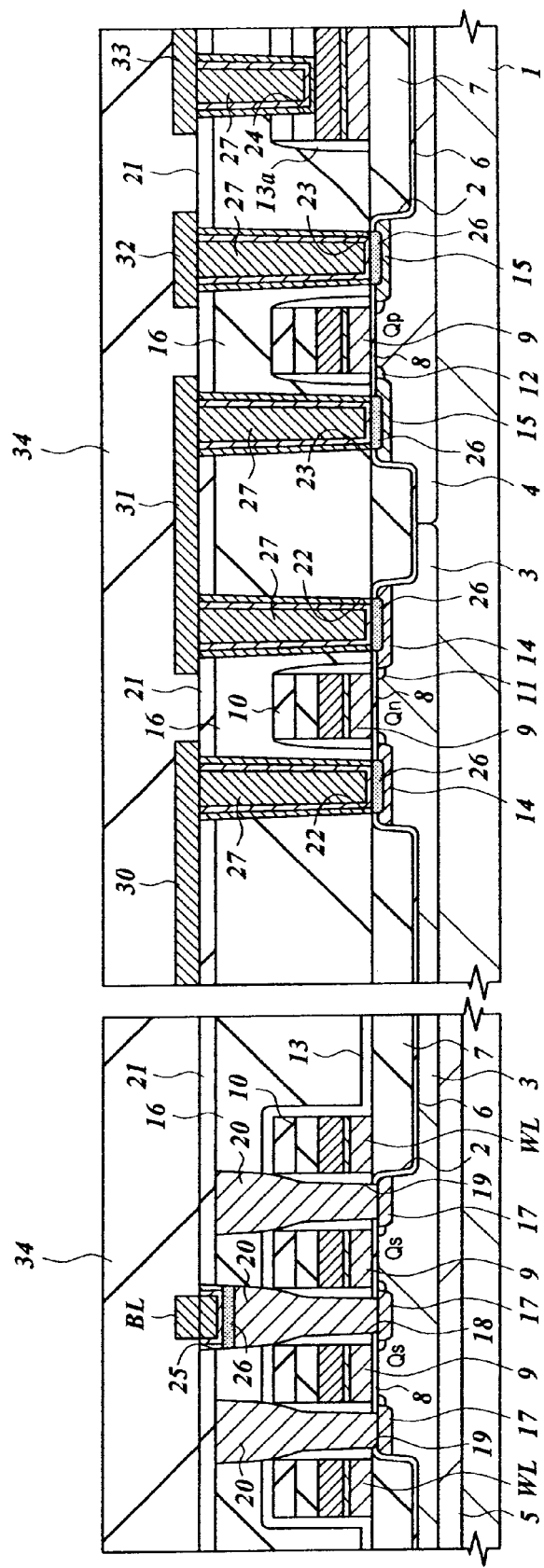
FIG. 19 is a schematic cross sectional view of a principal portion of a substrate, also illustrating the embodiment of method of manufacturing a semiconductor integrated circuit device according to the invention.

Thereafter, as shown in FIG. 19, an about 300 nm thick SOG film 34 is formed on the bit line BL and the first layer wires 30 through 33 by means of the technique described above by referring to the SOG film 16. More specifically, a liquid substance (chemical solution) containing hydrosilsesquioxan as principal ingredient is applied to the substrate 1 now carrying the bit line BL and the first layer wires 30 through 33 by spin coating and baked at about 90° C. for a minute and then at about 150° C. for another minute. Then, the solvent is gasified and dispelled by heat-treating the substance at about 800° C. for about 5 to 10 minutes in an oxygen-containing atmosphere to produce a dense SOG film 34 having a molecular structure as expressed by chemical formula (3). For the reasons as described earlier, the high temperature heat treatment process for producing a dense SOG film 34 is conducted at temperature slightly higher than the subsequent heat treatment process for producing a capacitive insulating film.

If the surface of the SOG film 34 shows undulations due to the presence of the bit line BL and the wires 30 through 33, it is planarized by chemical and mechanical polishing.

Figure 20:
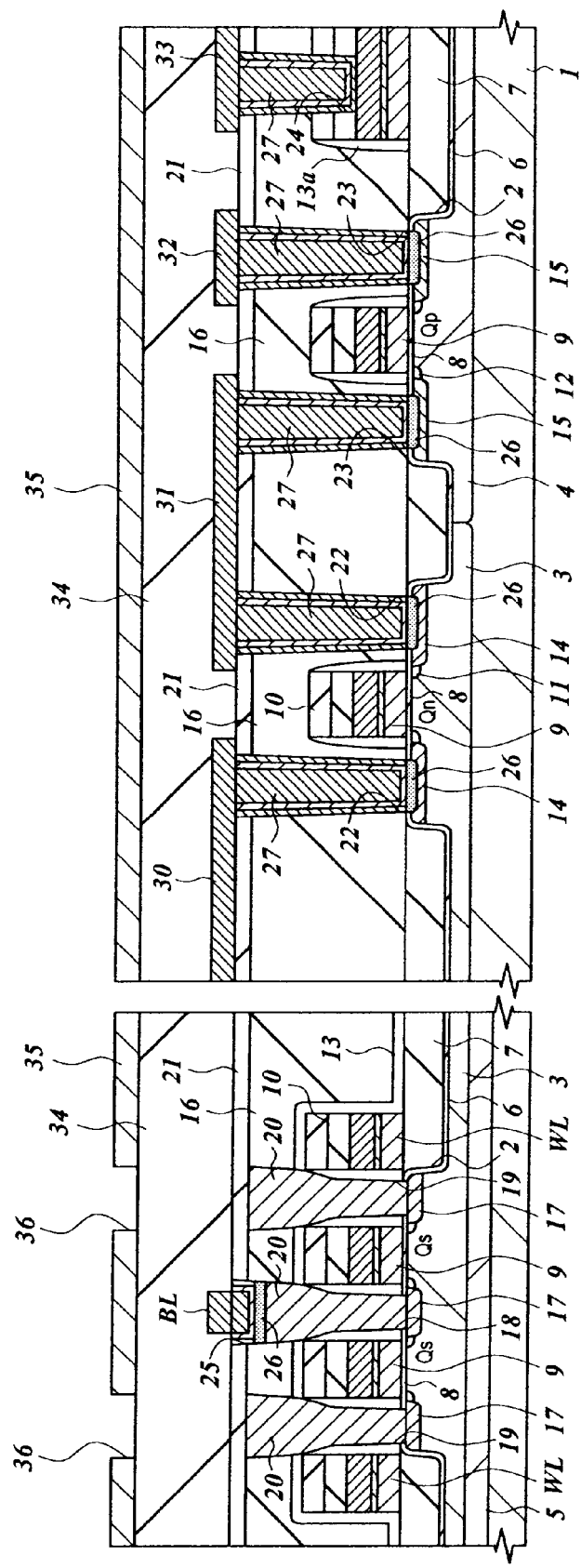
FIG. 20 is a schematic cross sectional view of a principal portion of a substrate, also illustrating the embodiment of method of manufacturing a semiconductor integrated circuit device according to the invention.

Then, as shown in FIG. 20, an about 200 nm thick polycrystalline silicon film 35 is deposited on the SOG film 34 by CVD and then dry etched from the memory cell array by using a photoresist film as mask to produce grooves 36 in the polycrystalling silicon film 35 that are located above the respective contact holes 19.

Figure 21:
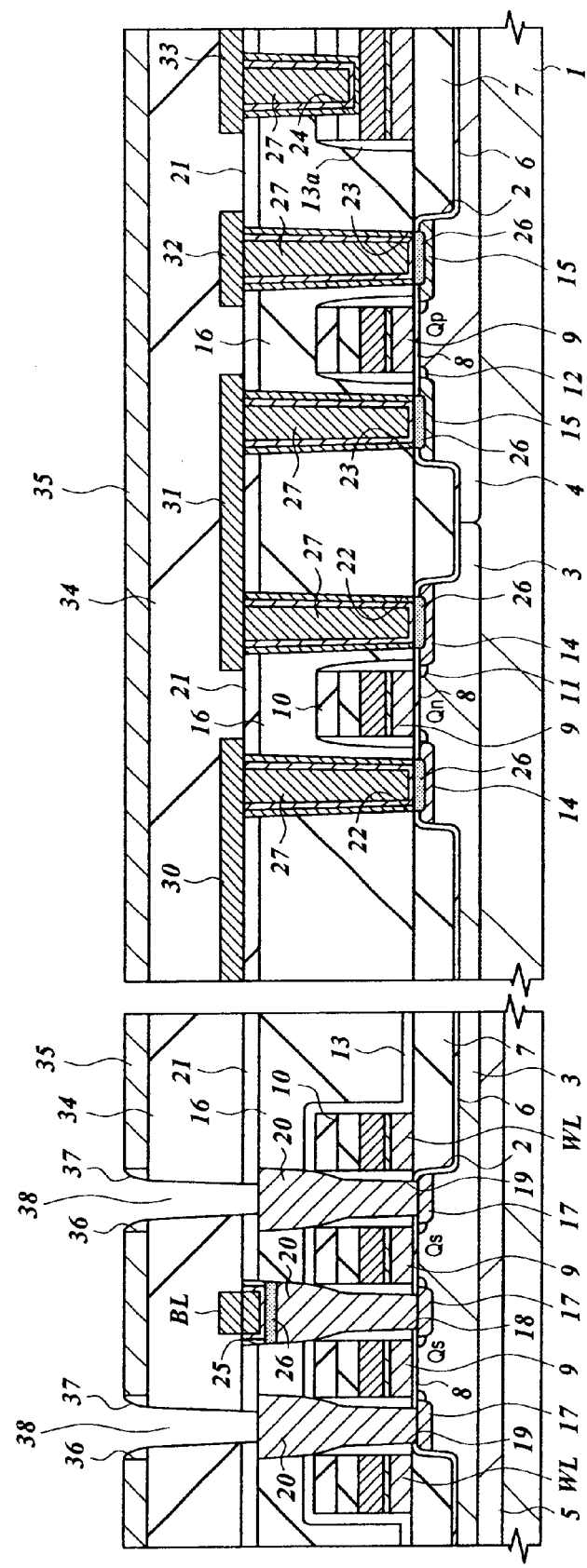
FIG. 21 is a schematic cross sectional view of a principal portion of a substrate, also illustrating the embodiment of method of manufacturing a semiconductor integrated circuit device according to the invention.

Then, as shown in FIG. 21, side wall spacers 37 are formed along the lateral walls of the grooves 36 and subsequently the SOG film 34 and the underlying silicon oxide film 21 are dry etched by using the side wall spacers 37 and the polycrystalline silicon film 35 as mask to produce through holes 38 above the respective contact holes 19. Note that the side wall spacers 37 along the lateral walls of the grooves 36 are formed by depositing a polycrystalline silicon film on the polycrystalline silicon film 35 including the inside of the grooves 36 by means of CVD and then anisotropically etching the polycrystlline silicon film until it is left only along the lateral walls of the grooves 36.

As the through holes 38 are formed from the bottoms of the grooves 36 having the side wall spacers 37 formed along their lateral walls, the diameter of the through holes 38 are made smaller than that of the contact holes 19 located thereunder. As a result, a reliable alignment margin is provided when aligning the bit line BL and the through hole 38 if the size of the memory cell array is reduced so that any possible short-circuiting of the plugs 39 that are buried in the respective through holes 38 in the next step and the bit line BL will be reliably eliminated.

Figure 22:
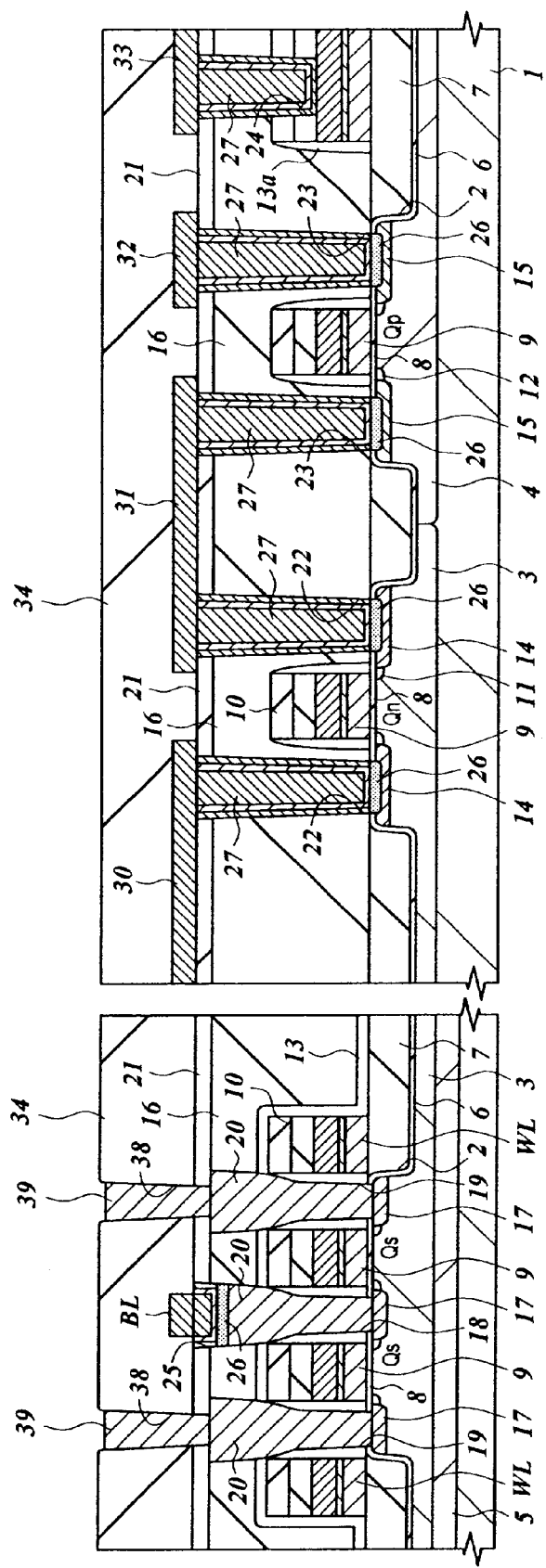
FIG. 22 is a schematic cross sectional view of a principal portion of a substrate, also illustrating the embodiment of method of manufacturing a semiconductor integrated circuit device according to the invention.

Then, after dry etching the polycrystalline silicon film 35 and the side wall spacers 37 to remove them, plugs 39 are formed in the respective through holes 38 as shown in FIG. 22. More specifically, the plugs 39 are formed by depositing a low-resistance polycrystalline silicon film doped with an n-type impurity substance (phosphor) on the SOG film 34 including the through holes 38 by CVD and then etching back the polycrystalline silicon film until it is left only in the inside of the through holes 38.

Figure 23:
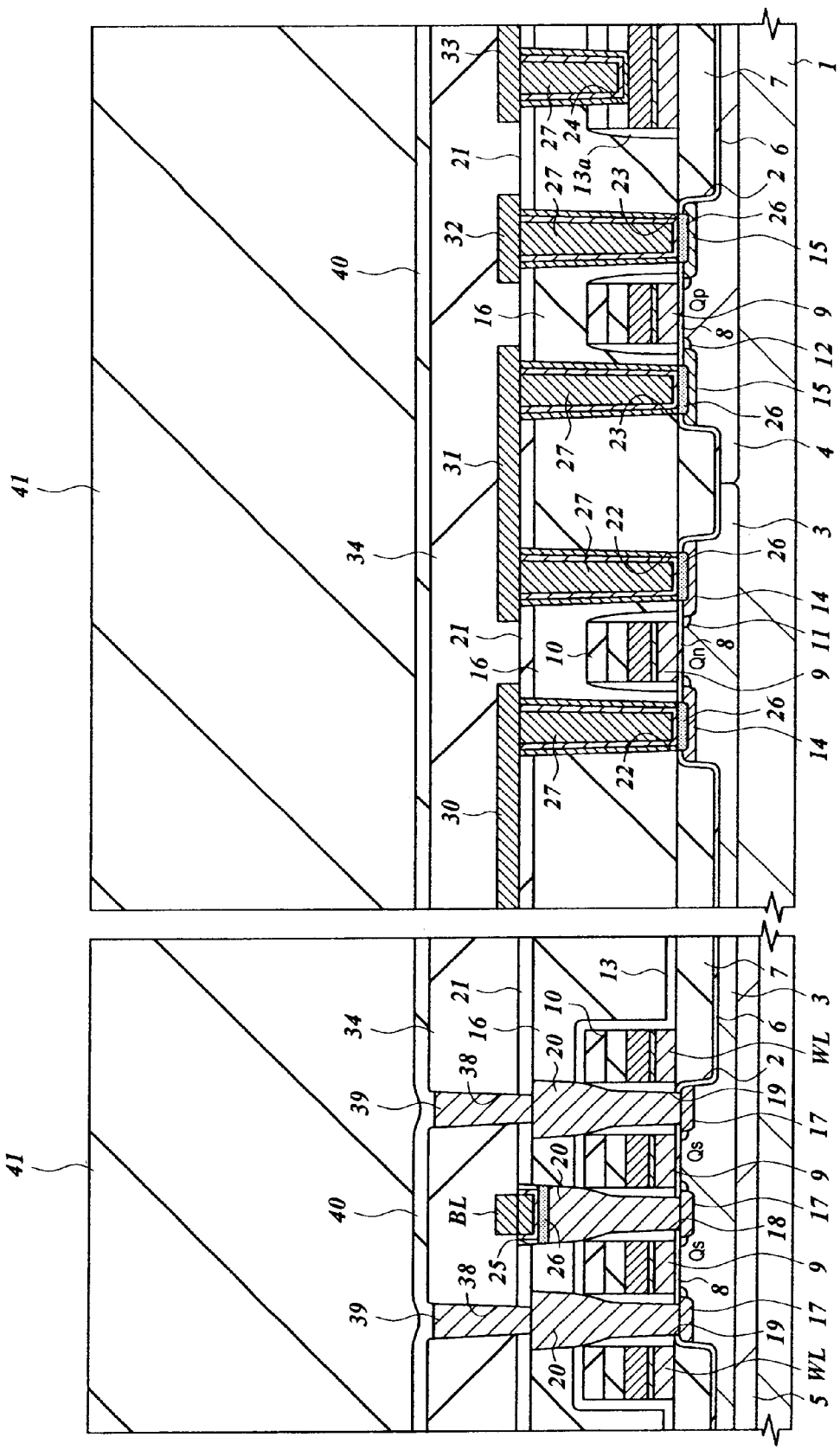
FIG. 23 is a schematic cross sectional view of a principal portion of a substrate, also illustrating the embodiment of method of manufacturing a semiconductor integrated circuit device according to the invention.
Figure 24:
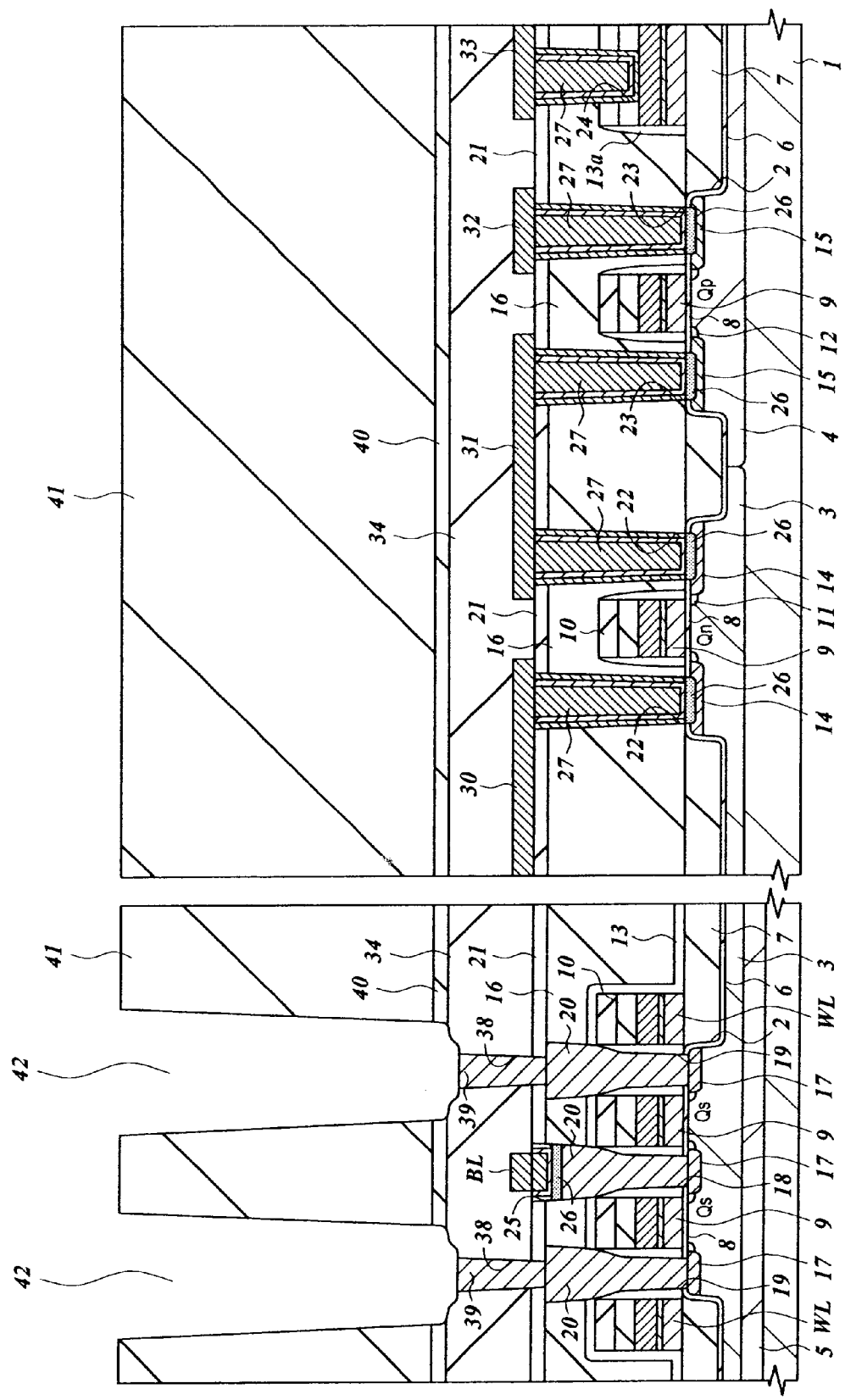
FIG. 24 is a schematic cross sectional view of a principal portion of a substrate, also illustrating the embodiment of method of manufacturing a semiconductor integrated circuit device according to the invention.

Thereafter, as shown in FIG. 23, an about 100 nm thick silicon nitride film 40 is deposited on the SOG film 34 by CVD and subsequently a silicon oxide film 41 is deposited above the silicon nitride film 40 also by CVD. Then, the silicon oxide film 41 is dry etched from the memory cell array by using a photoresist film (not shown) as mask and subsequently the silicon nitride film 40 underlying the silicon oxide film is also dry etched to produce grooves 42 above the respective through holes 38. Since the lower electrodes of the capacitive elements for storing information are formed along the inner walls of the grooves 42, a relatively thick (e.g., about 1.3 $\mu$m thick) oxide film 41 has to be deposited to produce the grooves 42 when the lower electrodes are required to have a large surface area in order to increase the electric charge to be stored there.

Figure 25:
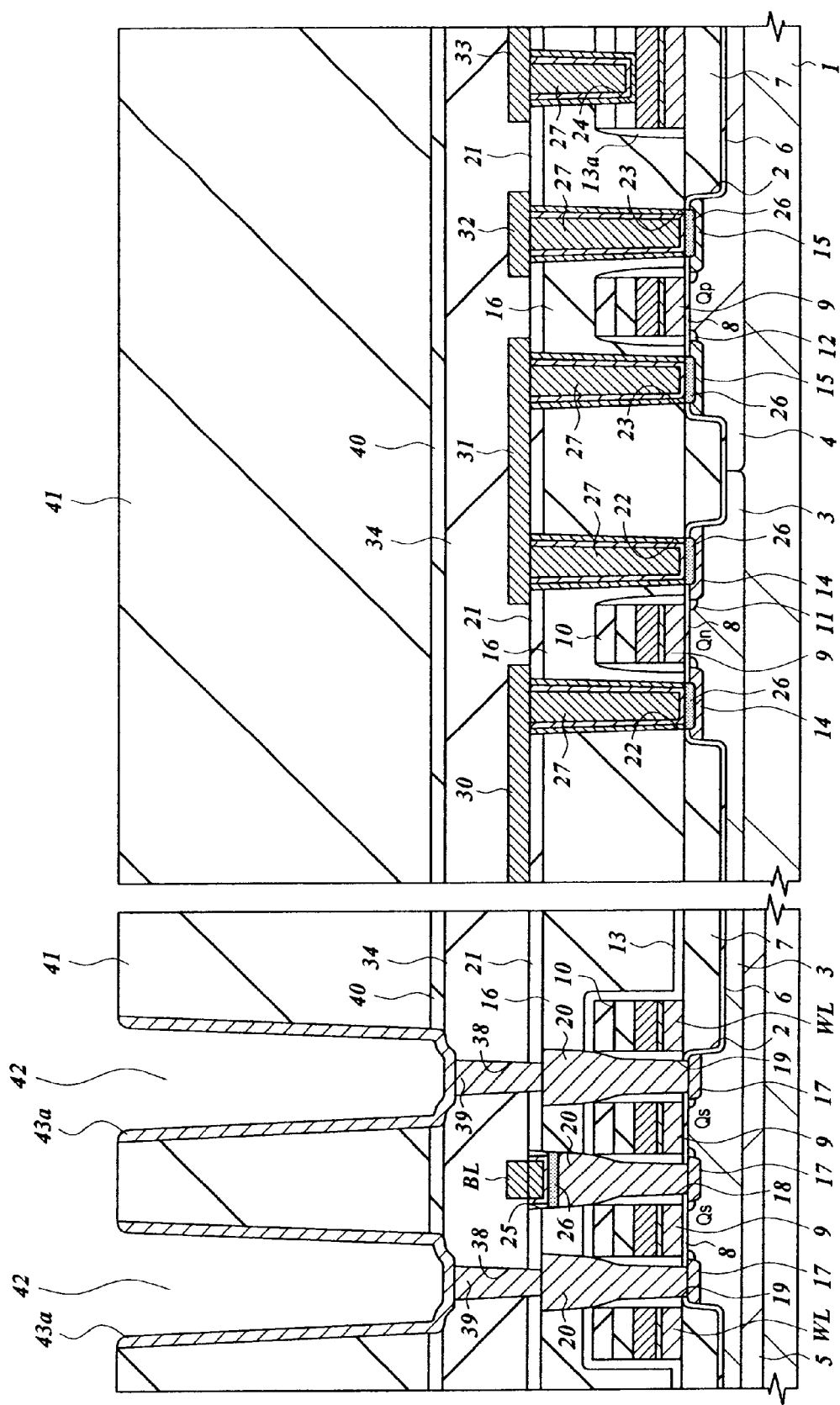
FIG. 25 is a schematic cross sectional view of a principal portion of a substrate, also illustrating the embodiment of method of manufacturing a semiconductor integrated circuit device according to the invention.

Then, as shown in FIG. 25, an about 50 nm thick amorphous silicon film 43a doped with an n-type impurity substance (phosphor) is deposited on the silicon oxide film 41 including the inside of the grooves 42 by CVD and subsequently it is etched back from the top of the silicon oxide film 41 to make the amorphous silicon film 43a left only on the inner walls of the grooves 42.

Figure 26:
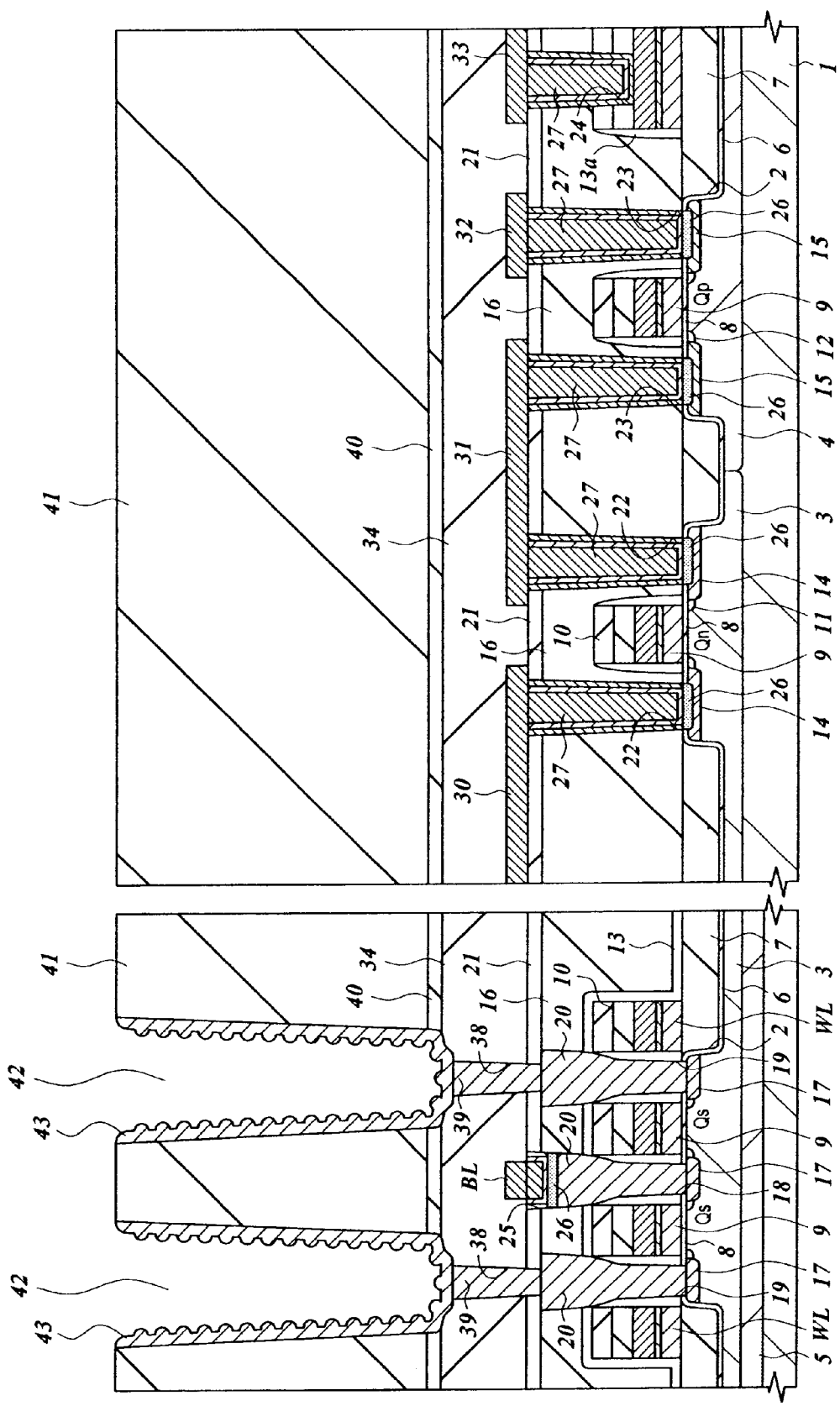
FIG. 26 is a schematic cross sectional view of a principal portion of a substrate, also illustrating the embodiment of method of manufacturing a semiconductor integrated circuit device according to the invention.

Then, as shown in FIG. 26, the surface of the amorphous silicon film 43a left in the grooves 42 are wet-cleaned with a cleaning solution containing hydrofluoric acid, and monosilane (SiH$_4$) is supplied to the surface of the amorphous silicon film 43a in a low pressure atmosphere. Subsequently, the substrate 1 is heat-treated to turn the amorphous silicon film 43a into polycrystalline silicon film and, at the same time, grow silicon particles on the surface. As a result, a polycrystalline silicon film 43 is formed with a coarsened surface on the inner walls of the grooves 42. The polycrystalline silicon film 43 is used for the lower electrodes of the capacitive elements for storing information.

Figure 27:
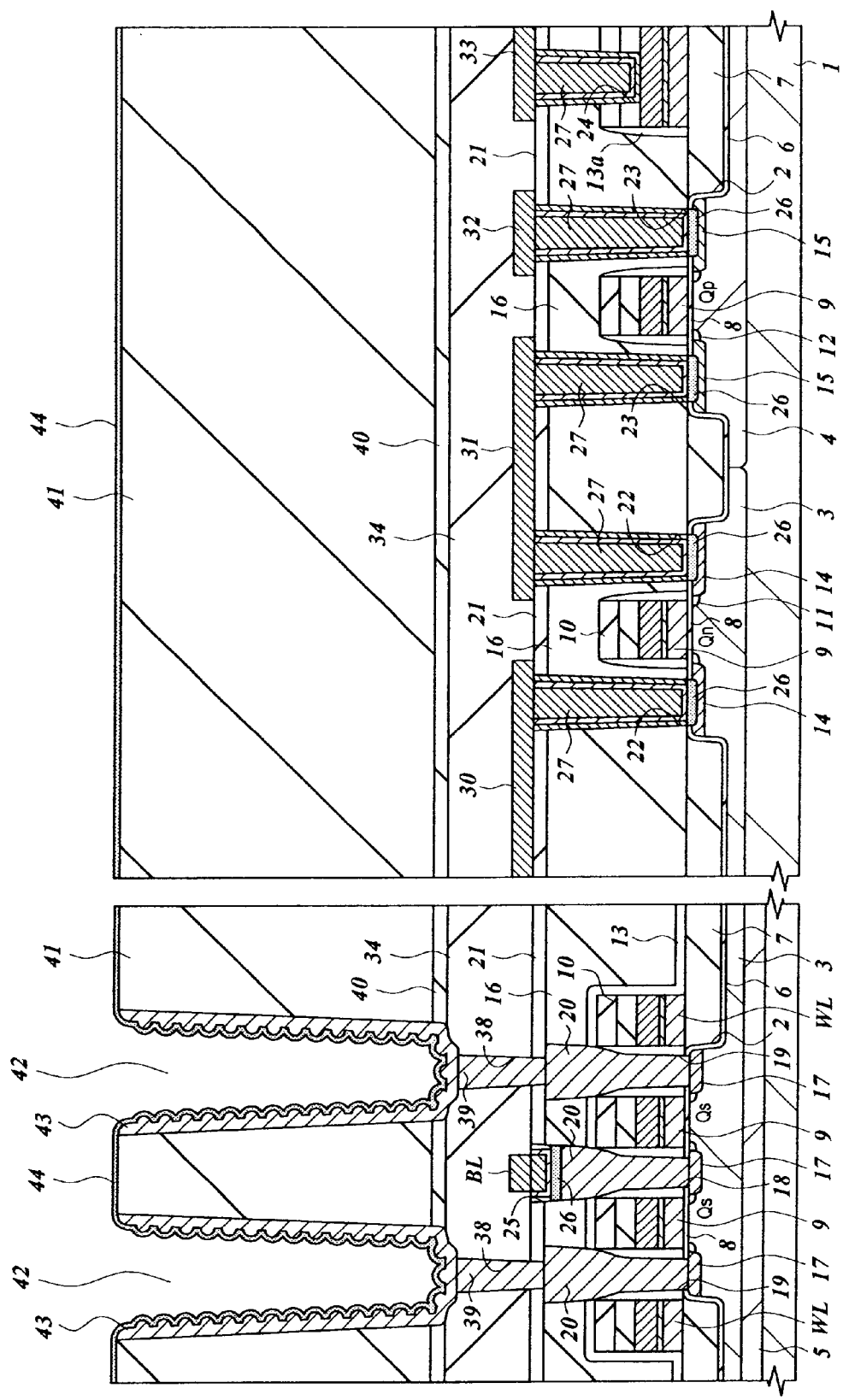
FIG. 27 is a schematic cross sectional view of a principal portion of a substrate, also illustrating the embodiment of method of manufacturing a semiconductor integrated circuit device according to the invention.

Then, as shown in FIG. 27, an about 15 nm thick tantalum oxide (Ta$_2$O$_5$) film 44 is deposited on the silicon oxide film 41 including the inside of the grooves 42 by CVD and subsequently heat-treated at about 800° C. for 3 minutes in an oxygen-containing atmosphere to crystallize the tantalum oxide film 44 and, at the same time, repair the defects, if any, thereof by means of oxygen fed to it. The tantalum oxide film 44 is used as capacitive insulating film for the capacitive elements for storing information.

As described above, the high temperature heat treatment for densifying the SOG film 16 and that of densifying the SOG film 34 are conducted at temperature higher than the heat treatment for crystallizing the tantalum oxide film 44. Therefore, the film quality of the SOG film 16 and that of the SOG film 34 would not be degraded by the high temperature heat treatment of the tantalum oxide film 44.

Figure 28:
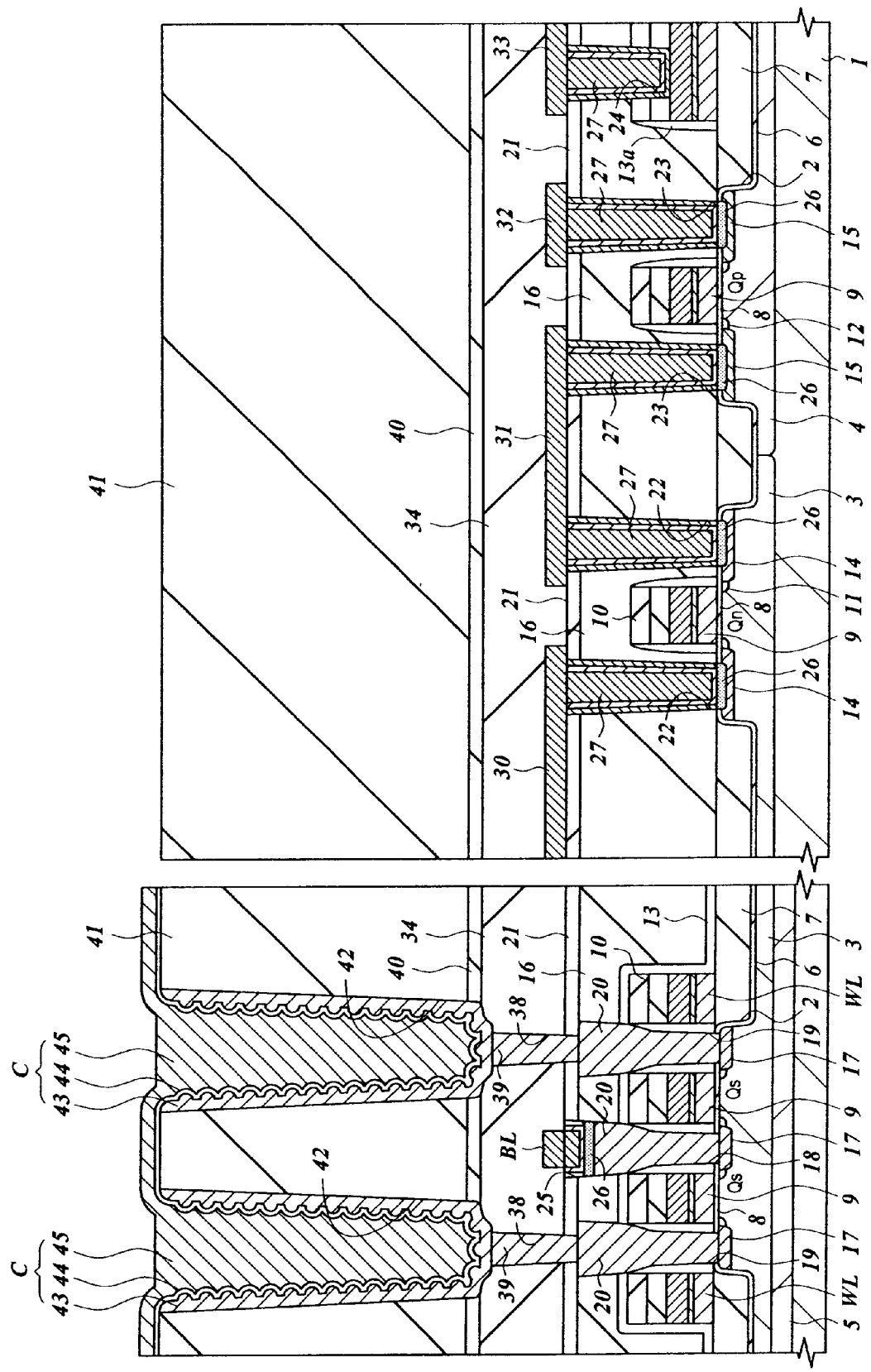
FIG. 28 is a schematic cross sectional view of a principal portion of a substrate, also illustrating the embodiment of method of manufacturing a semiconductor integrated circuit device according to the invention.

Then, as shown in FIG. 28, an about 150 nm thick TiN film 45 is deposited on the tantalum oxide film 44 including the inside of the groove 42 by means of a combined used of CVD and sputtering and subsequently the TiN film 45 and the tantalum oxide film 44 are dry etched by using a photoresist film (not shown) as mask to produce capacitive elements C for storing information, each comprising an upper electrode made of the TiN film 45, a capacitive insulating made of the tantalum oxide film 44 and a lower electrode made of the polycrystalling silicon film 43. Thus, the memory cells of the DRAM including memory cell selecting MISFETs Qs and information storage capacitive elements C connected in series to the MISFETs Qs are completed by the above steps.

The capacitive insulating film of the information storage capacitive elements C should not necessarily be made of a tantalum oxide film 44 and may alternatively be made of a film containing a high dielectric or ferroelectric substance having a perovskite or complex perovskite crystal structure such as PZT, PLT, PLZT, PbTiO$_3$, SrTiO$_3$, BaTiO$_3$, BST, SBT or Ta$_2$O$_5$ as principal ingredient.

Then, two aluminum (Al) wiring layers are formed on the information storage capacitive elements C in a manner as described below.

Figure 29:
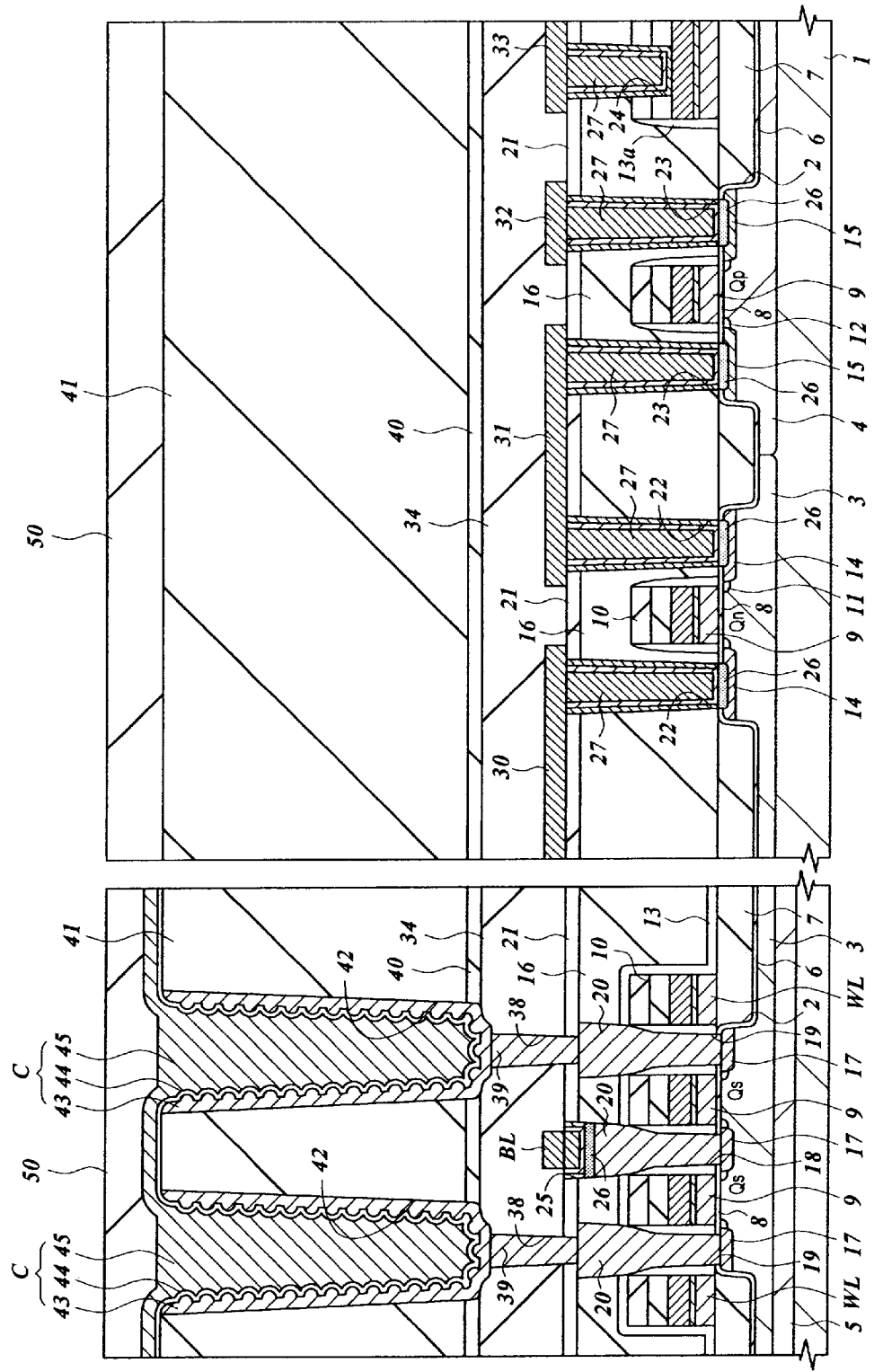
FIG. 29 is a schematic cross sectional view of a principal portion of a substrate, also illustrating the embodiment of method of manufacturing a semiconductor integrated circuit device according to the invention.

Firstly, as shown in FIG. 29, an about 100 nm thick silicon oxide film 50 is deposited on the information storage capacitive elements C by CVD. At this time, since a rather thick silicon oxide film 41 is left in the peripheral circuit region, the height (level) of the surface of the silicon oxide film 50 from the surface of the substrate 1 is substantially same in the memory cell array and in the peripheral circuit region.

Figure 30:
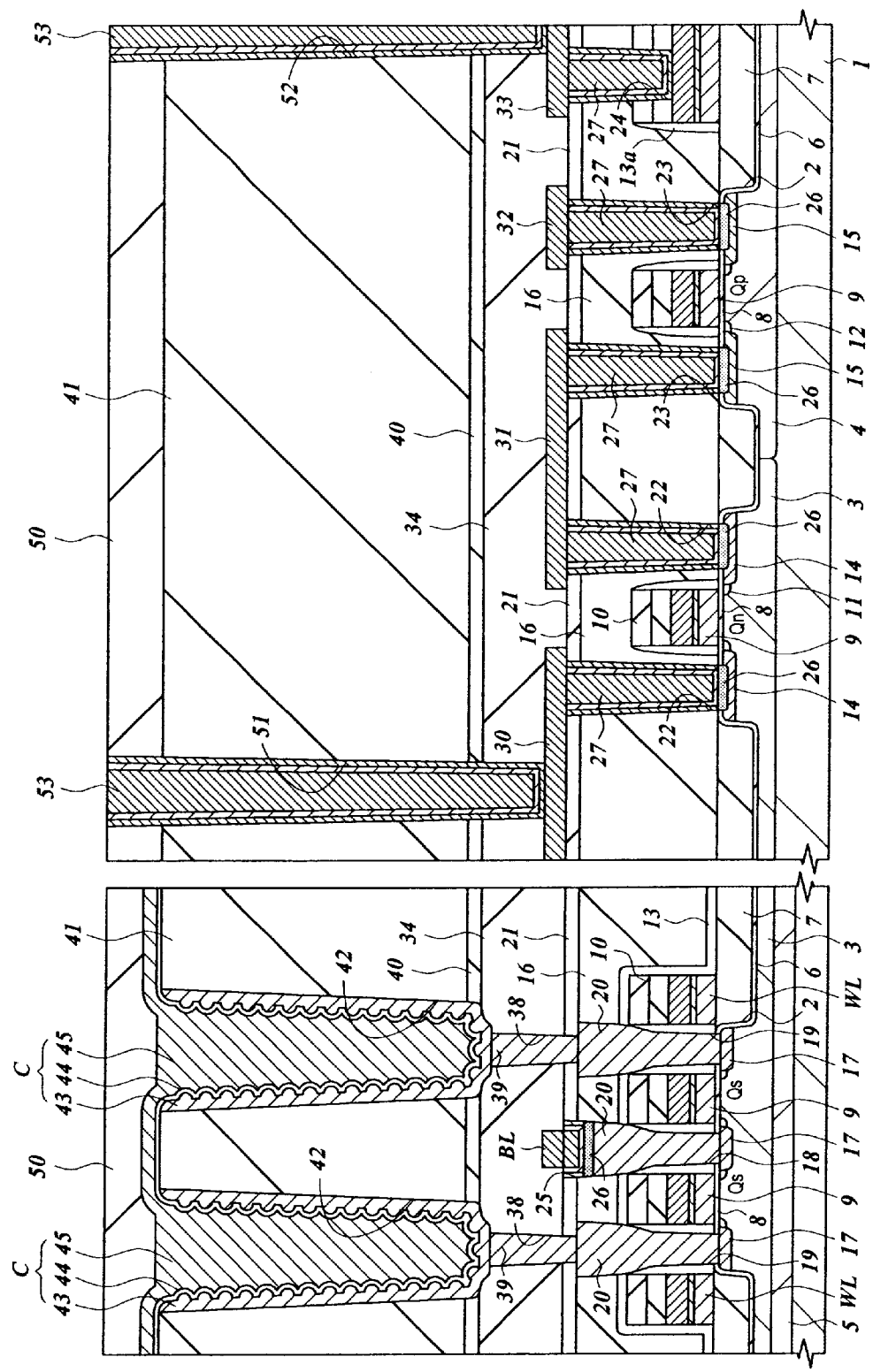
FIG. 30 is a schematic cross sectional view of a principal portion of a substrate, also illustrating the embodiment of method of manufacturing a semiconductor integrated circuit device according to the invention.

Then, as shown in FIG. 30, through holes 51, 52 are formed by dry etching the silicon oxide films 50, 41, the silicon nitride film 40 and the SOG film 34 above the first wiring layers 30, 33 in the peripheral circuit region by using a photoresist film (not sown) as mask. Subsequently, plugs 53 are formed in the through holes 51, 52 respectively by depositing an about 100 nm thick TiN film on the silicon oxide film 50 typically by means of sputtering and an about 500 nm thick W film thereon by means of CVD and subsequently etching back the films until they are left only in the through holes 51, 52.

Figure 31:
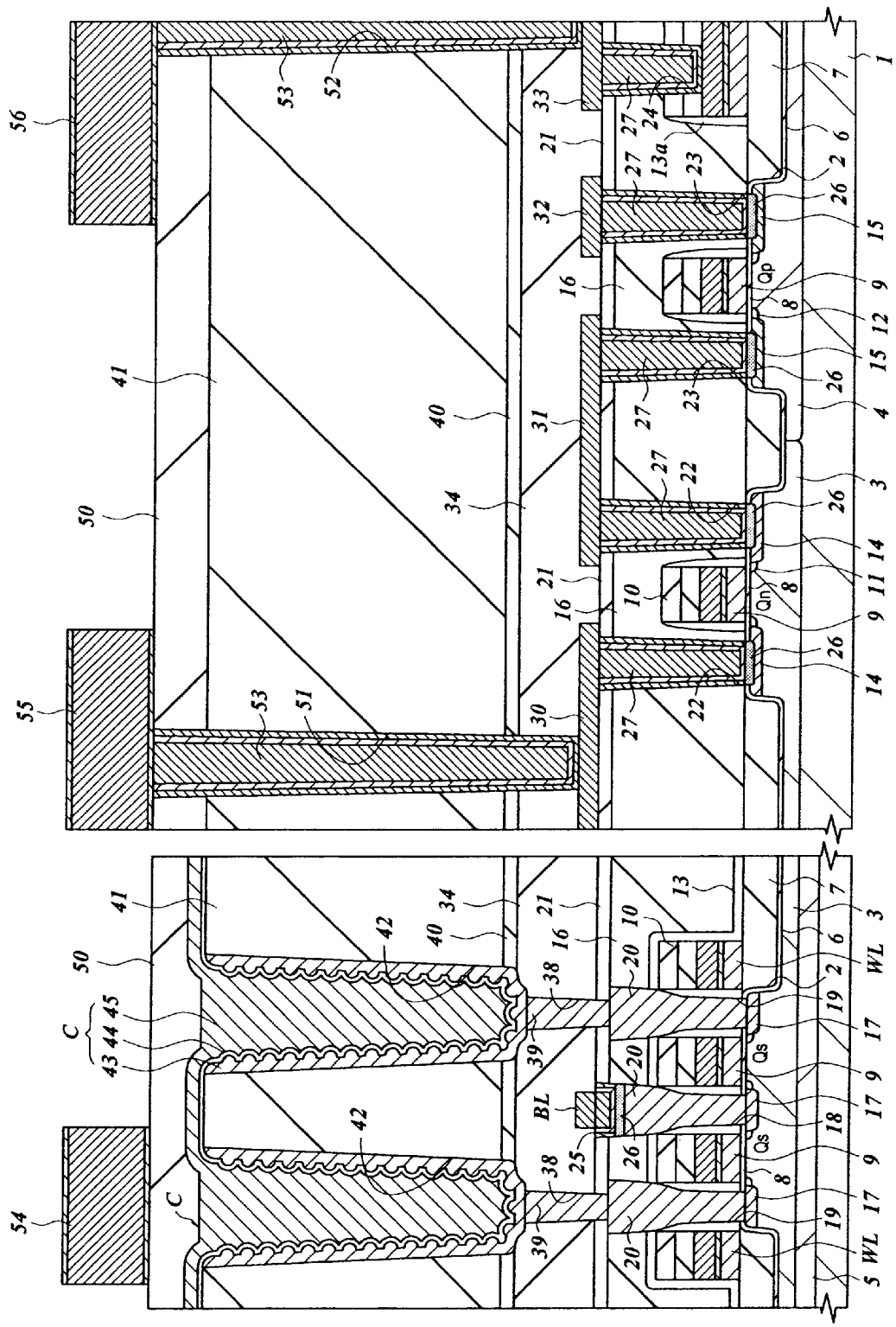
FIG. 31 is a schematic cross sectional view of a principal portion of a substrate, also illustrating the embodiment of method of manufacturing a semiconductor integrated circuit device according to the invention.

Then, as shown in FIG. 31, wires 54 through 56 of the second wiring layer are formed on the silicon oxide film 50. More specifically, the wires 54 through 56 are formed by sequentially depositing an about 50 nm thick TiN film, an about 500 nm thick aluminum (Al) alloy film and then another about 50 nm thick TiN film by sputtering on the silicon oxide film 50 and are then dry etching the films by using a photoresist film (not shown). Since the surface of the silicon oxide film 50 underlying the wires 54 through 56 in the memory cell array is flush with that of the silicon oxide film 50 in the peripheral circuit region, the wires 54 through 56 can be patterned with an enhanced precision level.

Figure 32:
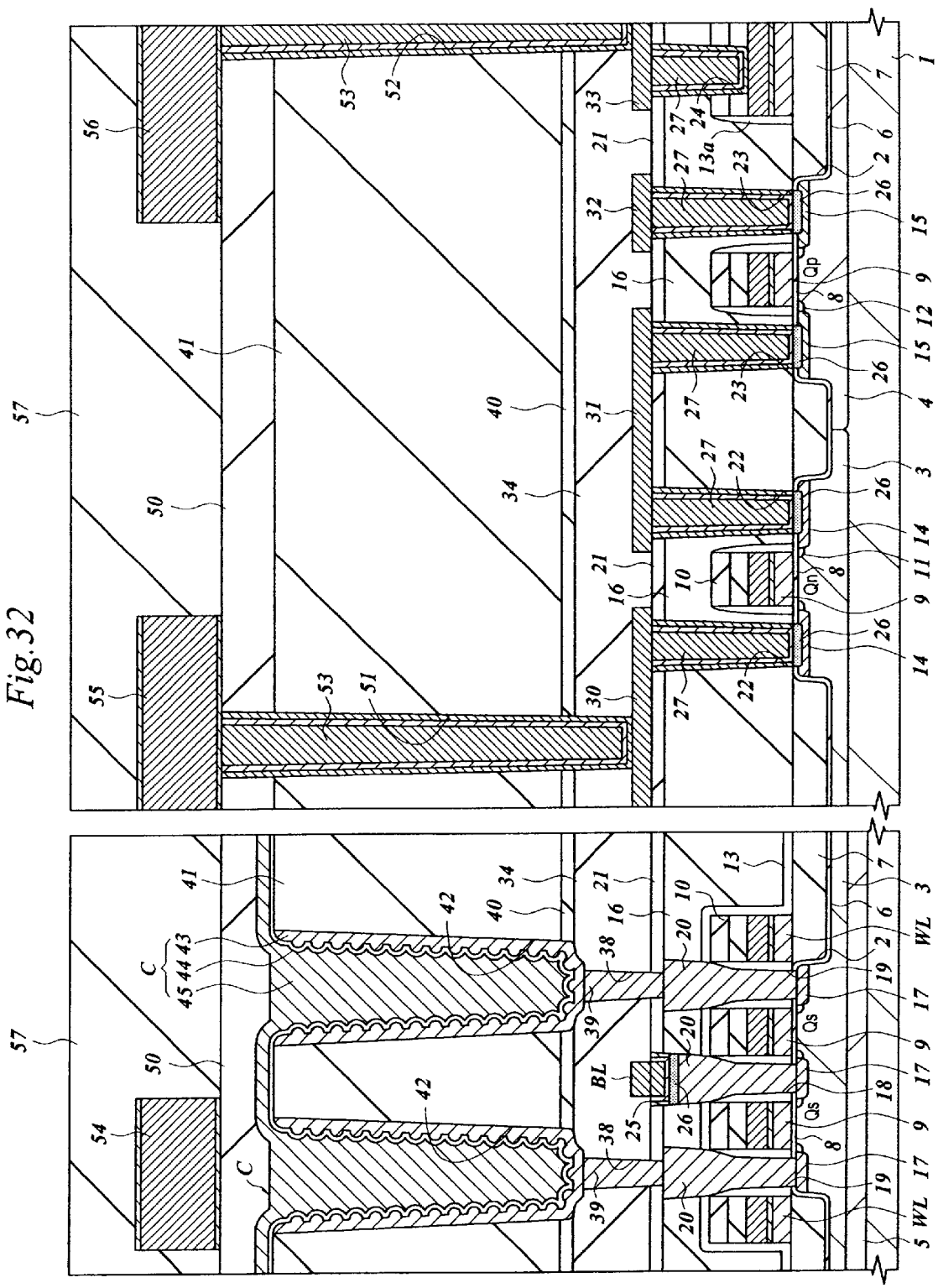
FIG. 32 is a schematic cross sectional view of a principal portion of a substrate, also illustrating the embodiment of method of manufacturing a semiconductor integrated circuit device according to the invention.

Thereafter, as shown in FIG. 32, an SOG film 57 is formed on the second layer wires 54 through 56. More specifically, the SOG film 57 is formed by applying a liquid substance (chemical solution) containing hydrosilsesquioxan as principal ingredient on the substrate 1 by spin coating, baking the substance at 90° C. for a minute and then at 150° C. for another minute and subsequently heat-treating it at about 400° C. for 30 minutes in an atmosphere of inert gas such as nitrogen to gasify the substance.

As described above, in the case of this embodiment of the invention, while the SOG films (16, 34) formed below the information storage capacitive elements C are densified by heat-treating them at high temperature of about 800° C., the SOG film 57 formed on the information storage capacitive elements C is not subjected to any heat treatment.

The relative dielectric constant of the SOG film 57 formed by heat treating hydrosilsesquioxan at about 400° C. is approximately between 3.2 and 3.4, which is lower than the relative dielectric constant (about 3.8 to 4.0) of the SOG films (16, 4) densified by means of a high temperature heat treatment. Thus, the inter-wire capacitance of the DRAM can be reduced to improve the operating speed of the DRAM by arranging an SOG film 57 having a low dielectric constant as insulating film between the wires 54 through 56 of the second wiring layer and the wires of the third wiring layer formed thereon in a subsequent step.

Note that the interlayer insulating film arranged between the wires 54 through 56 of the second wiring layer and the third wiring layer may be made to have a three-layered structure (silicon oxide film/SOG film/silicon oxide film) by depositing silicon oxide films respectively on and under the low dielectric constant SOG film 57 by means of plasma CVD. Alternatively, if the inter-wire capacitance is not a serious problem, the low dielectric constant SOG film 57 may be replaced by a polysilazan type SOG film (with a relative dielectric constant of about 4.0 to 5.0). However, in any case, the heat treatment of the SOG film has to be conducted at temperature not by far higher than 400° C. in order to prevent the wires 54 through 56 mainly made of an aluminum (Al) film and the capacitive elements made of a tantalum oxide film 44 from being degraded by heat.

When the relatively thick insulating film formed between the wires 54 through 56 of the second wiring layer and the wires of the third wiring layer solely consists of an SOG film 57, it may be difficult to obtain the film thickness (800 to 1,000nm) required for an interlayer insulating film simply by applying a chemical solution of hydrosilsesquioxan in a single process. If, on the other hand, a chemical solution of hydrosilsesquioxan is applied onto the existing SOG film 57 in order to raise the thickness of the SOG film, the surface of the existing SOG film would strongly repels the applied chemical solution because the surface of the SOG film 57 made of hydrosilsesquioxan is full of Si—H bonds.

However, when applying hydrosilsesquioxan onto an SOG film of hydrosilsesquioxan to raise the thickness of the film, this problem can be bypassed by heat treating the film at about 400° C. to harden it and subsequently irradiating the surface of the film with ultraviolet rays in an oxygen-containing atmosphere to modify the surface of the film before applying the chemical solution of hydrosilsesquioxan thereto. With this arrangement, a relatively thick SOG film 57 can be formed with a uniform film thickness that can not be achieved by a single spin coating so that the space separating the wires 54 through 56 can be filled with the SOG film 57 without losing the planar surface of the film.

Figure 33:
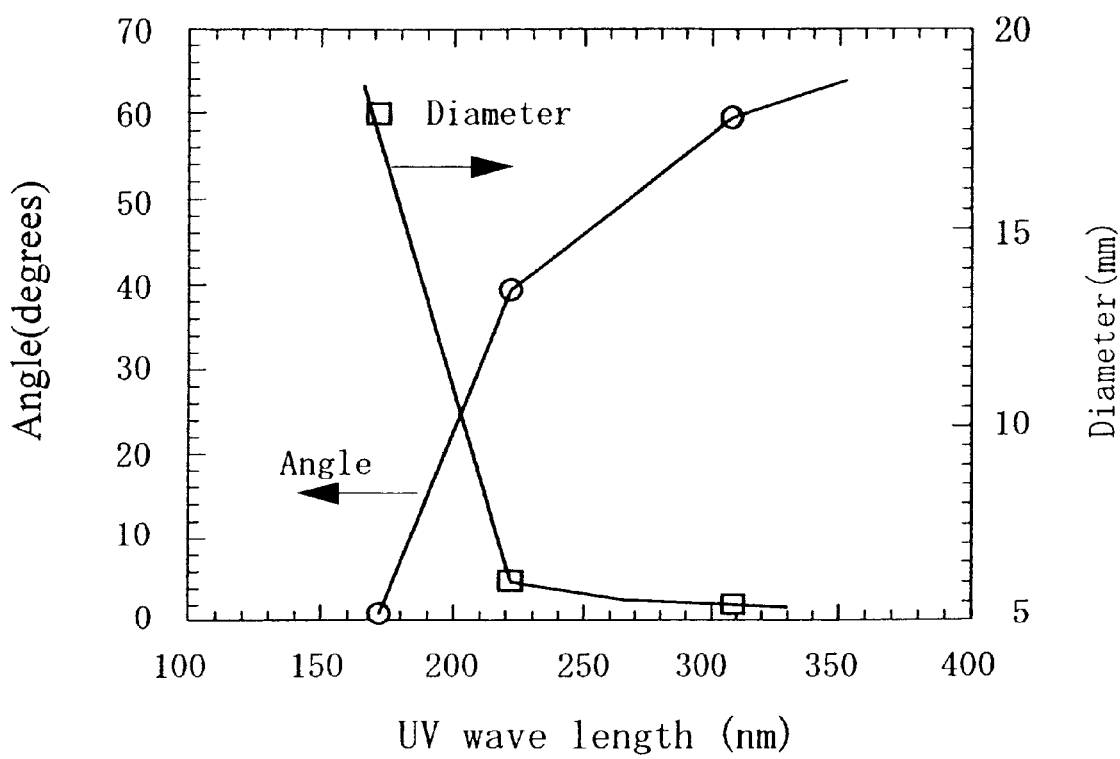
FIG. 33 is a graph illustrating the relationship between the contact angle and the diameter of the water drop made to fall onto the surface of an SOG film (HSQ-SOG) made of hydrosilsesquioxan and the wavelength of the ultraviolet rays used to irradiate the surface of the film observed in an experiment.
Figure 34:
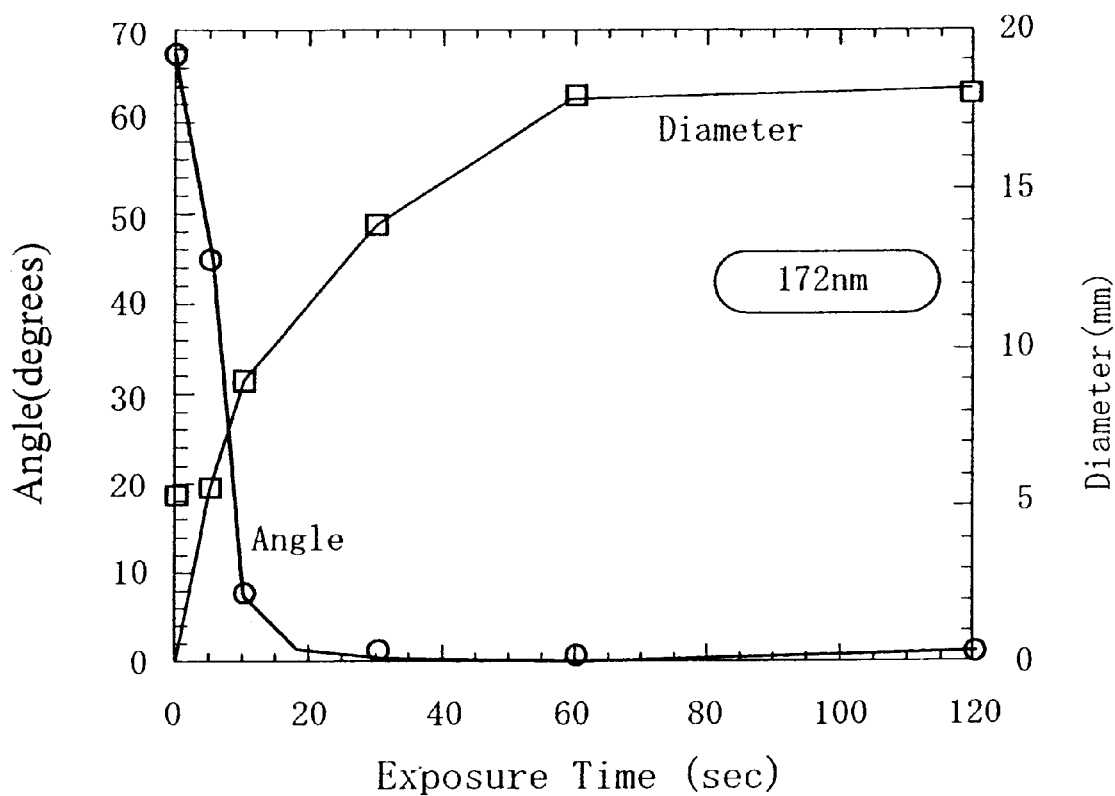
FIG. 34 is a graph illustrating the relationship between the contact angle and the diameter of the water drop made to fall on the surface of an SOG film (HSQ-SOG) made of hydrosilsesquioxan and the duration of irradiation of ultraviolet rays to the surface of the film observed in an experiment.

FIG. 33 is a graph showing the relationship between the contact angle and the diameter of the water drop made to fall on the surface of an SOG film (HSQ-SOG) made of hydrosilsesquioxan and the wavelength of the ultraviolet rays used to irradiate the surface of the film observed in an experiment. FIG. 34 is a graph showing the relationship between the contact angle and the diameter of the water drop made to fall on the surface of an SOG film (HSQ-SOG) made of hydrosilsesquioxan and the duration of irradiation of ultraviolet rays (wavelength=172 nm) to the surface of the film observed in an experiment.

As shown in FIG. 33, the contact angle of the water drop is reduced and its diameter of the water drop is increased when the wavelength of the irradiated ultraviolet rays falls below 200 nm. Meanwhile, as shown in FIG. 34, the contact angle of the water drop is reduced and its diameter is increased when the duration of irradiation exceeds about 30 seconds. From these findings, it will be same to say that the wetting propensity of the chemical solution is remarkably improved when the surface of the SOG film is irradiated with ultraviolet rays having a wavelength less than 200 nm for more than 30 seconds.

Then, as shown in FIG. 35, a through hole 58 is formed above the information storage capacitive elements C by dry etching the SOG film 57 of the memory cell array and the underlying silicon oxide film 50 by using a photoresist film (not shown) as mask. Additionally, another through hole 59 is formed above the wire 56 by dry etching the SOG film 57 of the peripheral circuit region.

Then, plugs are formed respectively in said through holes 58, 59. However, before forming the plugs, side wall spacers 60 are formed on the inner walls of the through holes 58, 59 as shown in FIG. 36 prior to forming the through holes 58, 59 with this embodiment.

When through holes 58, 59 are formed by etching the SOG film 57 made of hydrosilsesquioxan, gas containing residual hydrogen can be released into the through holes 58, 59 from the inside of the film that is rich with Si—H bonds to consequently raise the electric resistance of the plugs. Therefore, with this embodiment, side wall spacers 60 are formed on the inner walls of the through holes 58, 59 to prevent gas from being discharged into the through holes 58, 59 and consequently prevent the plugs from raising their electric resistance.

The side wall spacers 60 are preferably made of a dense film showing a high gas barrier effect. For example, they may be made by depositing a silicon oxide film or a silicon nitride film on the SOG film 57 including the inside of the through holes 58, 59 by plasma CVD and subsequently anisotropically etching the film until it is completely removed except the inner walls of the through holes 58, 59.

Then, as shown in FIG. 37, after forming plugs 61 respectively in the through holes 58, 59, wires 62, 63 of the third wiring layer are prepared on the SOG film 57. More specifically, the plugs 61 are formed by depositing a W film (or a TiN film and a W film) on the SOG film 57 including the inside of the through holes 58, 59 by CVD and subsequently etching back the film on the SOG film 57 until it is completely removed except the inside of the through holes 58, 59. Then, the wires 62, 63 are formed by sequentially depositing an about 50 nm thick TiN film, an about 500 nm thick Al film and an about 50 nm thick Ti film on the SOG film 57 by sputtering and subsequently dry etching these films by using photoresist (not shown) as mask.

Thereafter, a passivation film comprising a silicon oxide film and a silicon nitride film is deposited on the wires 62, 62 of the third wiring layer, although not shown in the accompanying drawing. With the above described steps, a DRAM according to the invention is substantially completed.

While the present invention is described in detail by way of an embodiment, the present invention is by no means limited to the embodiment, which may be modified or altered in various different ways without departing from the scope of the invention.

While the embodiment is applied to a DRAM in the above description, the present invention is by no means limited thereto and can find various applications when forming an insulating film for an LSI that is to be manufactured with a design rule adapted to dimensions not exceeding 0.25 μm.

Thus, briefly the present invention provides the following advantages.

(1) According to the invention, it is now possible to form a dense SOG film that does not contain any nitrogen so that a self align contact can be realized with ease to a great encouragement of manufacturing semiconductor integrated circuit devices with mciro-dimensions.

(2) According to the invention, it is now possible to apply a CMP technique to an SOG film so that the time required for the process of forming an insulating film can be significantly reduced.

(3) According to the invention, the wiring delay of a semiconductor integrated circuit device can be reduced by using an SOG film having a low dielectric constant as interlayer insulating film arranged among metal wiring multilayers.

(4) According to the invention, the cost of manufacturing a semiconductor integrated circuit device can be significantly reduced by using a less expensive SOG film for an insulating film.

What is claimed is:

1. A method of manufacturing a semiconductor integrated circuit device, comprising steps of:

(a) forming a first insulating film by applying a liquid substance containing a polymer of silicon, oxygen and hydrogen as principal ingredient, the liquid substance including a solvent, over a principal surface of a semiconductor substrate and subsequently subjecting said liquid substance to a first heat treatment, thereby gasifying the solvent;

(b) subjecting said first insulating film to a second heat treatment in an oxygen-containing atmosphere, and subsequently chemically and mechanically polishing a surface of said first insulating film;

(c) forming a conductor member by forming a conductor film on said first insulating film and subsequently by etching said conductor film; and (d) forming a second insulating film on said conductor member.

2. A method of manufacturing a semiconductor integrated circuit device according to claim 1, wherein the relative dielectric constant of said second insulating film is lower than that of said first insulating film.

3. A method of manufacturing a semiconductor integrated circuit device according to claim 1, wherein hydrogen content of said second insulating film is higher than that of said first insulating film.

4. A method of manufacturing a semiconductor integrated circuit device according to claim 1, wherein said second insulating film is formed by applying a liquid substance containing a polymer of silicon, oxygen and hydrogen as principal ingredient, the liquid substance including a solvent, over said conductor member and subsequently by subjecting said liquid substance to a first heat treatment, thereby gasifying the solvent.

5. A method of manufacturing a semiconductor integrated circuit device, comprising steps of:
   (a) forming a plurality of first conductor members over a principal surface of a semiconductor substrate, and subsequently applying a liquid substance containing a polymer of silicon, oxygen and hydrogen as principal ingredient, the liquid substance including a solvent, into a space between said first conductor members and also over said first conductor members;
   (b) forming an insulating film by subjecting said liquid substance to a first heat treatment, thereby gasifying the solvent, and subsequently subjecting it to a second heat treatment in an oxygen-containing atmosphere; and
   (c) forming a capacitive element, including a first electrode, a capacitive insulating film and a second electrode, over said insulating film.

6. A method of manufacturing a semiconductor integrated circuit device according to claim 5, wherein a temperature of said second heat treatment is higher than a temperature for forming said capacitive insulating film of said capacitive element.

7. A method of manufacturing a semiconductor integrated circuit device according to claim 5, wherein said capacitive insulating film of said capacitive element includes a film containing high dielectrics or ferroelectrics having a perovskite crystal structure or a complex perovskite crystal structure as principal ingredient.

8. A method of manufacturing a semiconductor integrated circuit device, comprising steps of:
   (a) forming a plurality of first conductor members over a principal surface of a semiconductor substrate and subsequently applying a first liquid substance containing a polymer of silicon, oxygen and hydrogen as principal ingredient, the first liquid substance including a solvent, into a space between said first conductor members and also over said first conductor members;
   (b) forming a first insulating film by subjecting said liquid substance to a first heat treatment, thereby gasifying the solvent, and subsequently subjecting it to a second heat treatment in an oxygen-containing atmosphere;
   (c) forming a capacitive element including a first electrode, a capacitive insulating film and a second electrode over said first insulating film, and subsequently applying a second liquid substance containing a polymer of silicon, oxygen and hydrogen as principal ingredient, the second liquid substance including a solvent, over said capacitive element; and
   (d) forming a second insulating film by subjecting said second liquid substance to a third heat treatment, thereby gasifying the solvent of the second liquid substance.

9. A method of manufacturing a semiconductor integrated circuit device according to claim 8, wherein said polymer is hydrosilsesquioxan.

10. A method of manufacturing a semiconductor integrated circuit device according to claim 8, wherein a temperature of said second heat treatment is higher than that of said first heat treatment and that of said third heat treatment.

11. A method of manufacturing a semiconductor integrated circuit device according to claim 8, wherein a temperature of said second heat treatment is higher than a temperature for forming said capacitive insulating film of said capacitive element.

12. A method of manufacturing a semiconductor integrated circuit device according to claim 8, wherein the relative dielectric constant of said second insulating film is lower than that of said first insulating film.

13. A method of manufacturing a semiconductor integrated circuit device according to claim 8, wherein said step of forming said capacitive element over said first insulating film includes a step of forming a third insulating film over said first insulating film by chemical vapor deposition, a step of forming a groove in said third insulating film and a step of forming said capacitive element in said groove.

14. A method of manufacturing a semiconductor integrated circuit device, comprising:
   a step of forming an MISFET over a principal surface of a semiconductor substrate and subsequently forming a first insulating film over said MISFET; and
   a step of forming a capacitive element including a first electrode, a capacitive insulating film and a second electrode over said first insulating film and subsequently forming a second insulating film over said capacitive element,
   wherein each of said first insulating film and said second insulating film includes an insulating film formed by applying a liquid substance containing a polymer of silicon, oxygen and hydrogen as principal ingredient, and the relative dielectric constant of said second insulating film is lower than that of said first insulating film.

15. A method of manufacturing a semiconductor integrated circuit device according to claim 14, wherein a surface of said first insulating film is planarized by chemical and mechanical polishing.

16. A method of manufacturing a semiconductor integrated circuit device according to claim 14, wherein the hydrogen content of said second insulating film is higher than that of said first insulating film.

17. A method of manufacturing a semiconductor integrated circuit device according to claim 14, further comprising forming a first metal wire on said second insulating film, and forming a second metal wire on said first metal wire with a third insulating film interposed therebetween, wherein said third insulating film includes an insulating film formed by applying a liquid substance containing a polymer of silicon, oxygen and hydrogen as principal ingredient, and wherein the relative dielectric constant of said third insulating film is lower than that of said first insulating film.

18. A method of manufacturing a semiconductor integrated circuit device, comprising steps of:
   (a) forming an MISFET over a principal surface of a semiconductor substrate and subsequently applying a first liquid substance containing a polymer of silicon, oxygen and hydrogen as principal ingredient;
   (b) forming a first insulating film by subjecting said first liquid substance to a first heat treatment, and subsequently subjecting said first insulating film to a second heat treatment to be conducted at a temperature higher than said first heat treatment in an oxygen-containing atmosphere;

(c) forming a metal wire containing aluminum as a principal ingredient on said first insulating film, and subsequently applying a second liquid substance containing a polymer of silicon, oxygen and hydrogen as principal ingredient over said metal wire; and (d) forming a second insulating film by subjecting said second liquid substance to a third heat treatment to be conducted at a temperature lower than said second heat treatment.

19. A method of manufacturing a semiconductor integrated circuit device according to claim 18, wherein the relative dielectric constant of said second insulating film is lower than that of said first insulating film.

20. A method of manufacturing a semiconductor integrated circuit device according to claim 18, wherein a temperature of said third heat treatment is lower than that of degrading said metal wire.

21. A method of manufacturing a semiconductor integrated circuit device according to claim 18, further comprising a step of planarizing a surface of said first insulating film by chemical and mechanical polishing to be conducted after said step (b).

22. A method of manufacturing a semiconductor integrated circuit device according to claim 18, further comprising:

(e) a step of irradiating ultraviolet rays to a surface of said second insulating film in an oxygen-containing atmosphere to be conducted after said step (d);

(f) a step of applying a third liquid substance containing a polymer of silicon, oxygen and hydrogen as principal ingredient to a surface of said second insulating film irradiated with ultraviolet rays; and (g) a step of raising a height of said second insulating film by subjecting said third liquid substance to a fourth heat treatment.

23. A method of manufacturing a semiconductor integrated circuit device, comprising steps of:

(a) forming an MISFET over a principal surface of a semiconductor substrate, and subsequently applying a first liquid substance containing a polymer of silicon, oxygen and hydrogen as principal ingredient over said MISFET;

(b) forming a first insulating film by subjecting said first liquid substance to a first heat treatment and subsequently subjecting said first insulating film to a second heat treatment to be conducted at a temperature higher than said first heat treatment in an oxygen-containing atmosphere;

(c) forming a capacitive element over said first insulating film, and subsequently applying a second liquid substance containing a polymer of silicon, oxygen and hydrogen as principal ingredient over said capacitive element; and (d) forming a second insulating film by subjecting said second liquid substance to a third heat treatment to be conducted at a temperature lower than said second heat treatment.

24. A method of manufacturing a semiconductor integrated circuit device according to claim 23, wherein a temperature of said third heat treatment is lower than that of degrading said capacitive insulating film of said capacitive element.

25. A method of manufacturing a semiconductor integrated circuit device, comprising steps of:

(a) forming a groove on an element isolating region of a principal surface of a semiconductor substrate, and subsequently applying liquid substance containing a polymer of silicon, oxygen and hydrogen as principal ingredient onto said semiconductor substrate including an inside portion of said groove;

(b) forming an insulating film by subjecting said liquid substance to a first heat treatment, and subsequently subjecting said insulating film to a second heat treatment, to be conducted at a temperature higher than said first heat treatment, in an oxygen-containing atmosphere; and (c) forming an element isolating groove on the principal surface of said semiconductor substrate by chemically and mechanically polishing said insulating film subjected to said second heat treatment, leaving said insulating film in an inside portion of said groove.

26. A method of manufacturing a semiconductor integrated circuit device according to claim 25, wherein said polymer is hydrosilsesquioxan.

* * * * *